(12) United States Patent
Choi et al.

(10) Patent No.: US 10,614,732 B2
(45) Date of Patent: Apr. 7, 2020

(54) STAGE CIRCUIT AND SCAN DRIVER USING THE SAME

(71) Applicant: Samsung Display Co., Ltd., Yongin-si (KR)

(72) Inventors: Deok Young Choi, Yongin-si (KR); Yong Jae Kim, Yongin-si (KR); Chang Yeop Kim, Yongin-si (KR); Jin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 99 days.

(21) Appl. No.: 15/692,609

(22) Filed: Aug. 31, 2017

(65) Prior Publication Data

US 2018/0240382 A1    Aug. 23, 2018

(30) Foreign Application Priority Data

Feb. 20, 2017    (KR) .......................... 10-2017-0022195

(51) Int. Cl.
| | |
|---|---|
| G09G 3/3266 | (2016.01) |
| G09G 3/3208 | (2016.01) |
| G09G 3/00 | (2006.01) |
| H03F 3/30 | (2006.01) |
| H03F 3/21 | (2006.01) |
| G09G 3/36 | (2006.01) |

(52) U.S. Cl.
CPC ........... *G09G 3/003* (2013.01); *G09G 3/3208* (2013.01); *G09G 3/3266* (2013.01); *G09G 3/3677* (2013.01); *G09G 3/3696* (2013.01); *H03F 3/211* (2013.01); *H03F 3/3022* (2013.01); *G09G 2310/0224* (2013.01); *G09G 2310/0286* (2013.01)

(58) Field of Classification Search
CPC ............................................. G09G 2310/0286
See application file for complete search history.

(56) References Cited

U.S. PATENT DOCUMENTS

| | | | |
|---|---|---|---|
| 7,982,699 B2 * | 7/2011 | Chung ................. | G09G 3/2014 345/76 |
| 8,299,982 B2 | 10/2012 | Chung | |
| 8,339,424 B2 | 12/2012 | Jeong et al. | |

(Continued)

FOREIGN PATENT DOCUMENTS

| | | |
|---|---|---|
| KR | 10-0646992 | 11/2006 |
| KR | 10-0911982 | 8/2009 |
| KR | 10-2016-0077315 | 7/2016 |

*Primary Examiner* — William Boddie
*Assistant Examiner* — Bipin Gyawali
(74) *Attorney, Agent, or Firm* — H.C. Park & Associates, PLC

(57) ABSTRACT

A stage circuit including an input unit controlling voltages of a first node and a second node by using a shift pulse or a gate start pulse input to a first input terminal, a first clock signal input to a second input terminal, a second clock signal input to a third input terminal, a first power supply input to a first power supply input terminal and a second power supply input to a second power supply input terminal, and a first output unit receiving a third clock signal from a fourth input terminal and the second power supply from the second power supply input terminal and outputting a high-level scan signal to a first output terminal corresponding to the voltages of the first node and the second node.

29 Claims, 21 Drawing Sheets

(56) References Cited

U.S. PATENT DOCUMENTS

| | | | | |
|---|---|---|---|---|
| 8,497,833 B2* | 7/2013 | Park | G09G 3/3266 | |
| | | | 315/169.2 | |
| 8,558,776 B2* | 10/2013 | Lee | G09G 3/3677 | |
| | | | 345/99 | |
| 8,582,715 B2* | 11/2013 | Chung | H03K 17/687 | |
| | | | 327/108 | |
| 8,599,117 B2* | 12/2013 | Jang | G09G 3/3266 | |
| | | | 345/77 | |
| 8,754,674 B2* | 6/2014 | Lee | G09G 3/3677 | |
| | | | 327/108 | |
| 8,780,102 B2* | 7/2014 | Han | G09G 3/3233 | |
| | | | 345/208 | |
| 8,810,552 B2* | 8/2014 | Chung | G11C 19/28 | |
| | | | 345/204 | |
| 8,912,996 B2* | 12/2014 | Kim | G09G 5/00 | |
| | | | 345/100 | |
| 9,129,562 B2* | 9/2015 | Jang | G09G 3/3266 | |
| 9,330,593 B2* | 5/2016 | Jang | G09G 3/32 | |
| 9,368,069 B2* | 6/2016 | Woo | G09G 3/3266 | |
| 9,406,261 B2* | 8/2016 | Kim | G09G 3/3266 | |
| 9,697,909 B2* | 7/2017 | Chen | G11C 19/28 | |
| 9,711,089 B2* | 7/2017 | Sun | G11C 19/287 | |
| 9,754,531 B2* | 9/2017 | Ji | G09G 3/32 | |
| 9,886,891 B2* | 2/2018 | In | G09G 3/3275 | |
| 9,922,611 B2* | 3/2018 | Zhao | G02F 1/1333 | |
| 9,997,101 B2* | 6/2018 | Sun | G09G 3/32 | |
| 10,002,558 B2* | 6/2018 | Ma | G09G 3/2092 | |
| 10,074,313 B2* | 9/2018 | Nishikawa | G09G 3/3266 | |
| 10,074,315 B2* | 9/2018 | Wang | G09G 3/3677 | |
| 10,089,919 B2* | 10/2018 | Zhao | G09G 3/20 | |
| 2007/0063933 A1* | 3/2007 | Chung | G09G 3/3266 | |
| | | | 345/76 | |
| 2015/0035732 A1* | 2/2015 | Lee | G09G 3/3266 | |
| | | | 345/76 | |
| 2015/0035733 A1* | 2/2015 | Woo | G09G 3/3266 | |
| | | | 345/76 | |
| 2015/0061982 A1* | 3/2015 | Woo | G09G 3/3266 | |
| | | | 345/82 | |
| 2017/0084222 A1* | 3/2017 | Sun | G09G 3/32 | |
| 2017/0249893 A1* | 8/2017 | Kim | G09G 3/2092 | |
| 2017/0287395 A1* | 10/2017 | Jang | G09G 3/3233 | |
| 2018/0090072 A1* | 3/2018 | Sun | G09G 3/3258 | |
| 2018/0233090 A1* | 8/2018 | Zhang | G09G 3/3266 | |
| 2019/0019462 A1* | 1/2019 | Kim | G09G 3/3266 | |
| 2019/0103067 A1* | 4/2019 | Kim | G09G 3/3677 | |

* cited by examiner

STAGE CIRCUIT AND SCAN DRIVER USING THE SAME

CROSS REFERENCE TO RELATED APPLICATION

This application claims priority from and the benefit of Korean Patent Application No. 10-2017-0022195, filed on Feb. 20, 2017, which is hereby incorporated by reference for all purposes as if fully set forth herein.

BACKGROUND

Field

Exemplary embodiments of the present invention relate to a stage circuit and a scan driver using the same.

Discussion of the Background

As information technology is developed, the importance of a display device, which is a connection medium between a user and information, has been emphasized. Thus, the use of display devices, such as a liquid crystal display device and an organic light emitting display device, has increased.

Generally, a display device includes a data driver supplying data signals to data lines, a scan driver supplying scan signals to scan lines, and a pixel array including pixels disposed in an area defined by the scan lines and the data lines.

The pixels included in the pixel array are selected when the scan signals are supplied to the scan lines and then supplied with the data signals from the data lines. The pixels receiving the data signals may emit light having a luminance level corresponding to the data signals.

The scan driver includes stages connected to the scan lines. The stages supply the scan signals to scan lines connected thereto corresponding to signals from a timing controller.

The pixels included in an organic light emitting display device are embodied by using NMOS and PMOS transistors to minimize a leakage current. Each of the NMOS and PMOS transistors included in a pixel is driven by the scan signal. The scan driver includes a stage for supplying a high-level scan signal corresponding to the NMOS transistor, and a stage for supplying a low-level scan signal corresponding to the PMOS transistor.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments of the invention provide a stage circuit supplying a high-level scan signal, and a scan driver using the same.

Exemplary embodiments of invention also provide a stage circuit supplying a high-level scan signal and a low-level scan signal at the same time, and a scan driver using the same.

Additional features of the invention will be set forth in the description which follows, and in part will be apparent from the description, or may be learned by practice of the invention.

An exemplary embodiment of the invention discloses a stage circuit including an input unit configured to control voltages of a first node and a second node by using a shift pulse or a gate start pulse input to a first input terminal, a first clock signal input to a second input terminal, a second clock signal input to a third input terminal, a first power supply input to a first power supply input terminal and a second power supply input to a second power supply input terminal, and a first output unit configured to receive a third clock signal from a fourth input terminal and the second power supply from the second power supply input terminal and to output a high-level scan signal to a first output terminal corresponding to the voltages of the first node and the second node.

When an ith (i is a natural number) stage circuit is set to a first stage, the gate start pulse may be supplied to the first input terminal, and otherwise, the shift pulse may be supplied from an (i−1)th stage to the first input terminal.

The first clock signal, the second clock signal, and the third clock signal may have the same cycle.

The first clock signal and the second clock signal may have a duty ratio of 50%, and the second clock signal may be set to a signal obtained by inverting the first clock signal.

The third clock signal may be set to a high level during a first period of one cycle and set to a low level during a second period longer than the first period.

A high-level period of the third clock signal may overlap a high-level period of the first clock signal.

The first power supply may be set to a gate-off voltage, and the second power supply may be set to a gate-on voltage.

The first output unit may include a first transistor connected between the fourth input terminal and the first output terminal and having a gate electrode connected to the first node, a second transistor connected between the first output terminal and the second power supply input terminal and having a gate electrode connected to the second node, and a first capacitor connected between the second node and the first output terminal.

The input unit may include a third transistor connected between the first power supply input terminal and a third node and having a gate electrode connected to the second input terminal, a fourth transistor connected between the third node and the third input terminal and having a gate electrode connected to a fourth node, a fifth transistor connected between the fourth node and the first input terminal and having a gate electrode connected to the second input terminal, a sixth transistor connected between the first power supply input terminal and the second node and having a gate electrode connected to the third node, a seventh transistor connected between the second node and the second power supply input terminal and having a gate electrode connected to the second input terminal, an eighth transistor connected between the first power supply input terminal and the first node and having a gate electrode connected to the second node, a ninth transistor connected between the first node and the second power supply input terminal and having a gate electrode connected to the third node, and a second capacitor connected between the third node and the fourth node.

A voltage of the third node or the voltage of the first node may be supplied as the shift pulse to a subsequent stage.

The stage circuit may further include a second output unit configured to receive a fifth clock signal from a fifth input terminal and the first power supply from the first power supply input terminal and to output a low-level scan signal to a second output terminal corresponding to the voltage of the second node and a voltage of the fourth node.

The fifth clock signal may be set to a signal obtained by inverting the third clock signal.

The second output unit may include a tenth transistor connected between the first power supply input terminal and the second output terminal and having a gate electrode connected to the second node, an eleventh transistor connected between the second output terminal and the fifth input terminal and having a gate electrode connected to a fifth node, a twelfth transistor connected between the fourth node and the fifth node and having a gate electrode connected to the fifth input terminal, a third capacitor connected between the fifth node and the second output terminal, and a fourth capacitor connected between the first power supply input terminal and the second node.

An exemplary embodiment of the invention also discloses a scan driver including a plurality of stages configured to supply a low-level first scan signal to a first scan line and a high-level second scan signal to a second scan line, wherein an ith (i is a natural number) stage may include an input unit configured to control voltages of a first node and a second node by using a shift pulse or a gate start pulse input to a first input terminal, a first clock signal input to a second input terminal, a second clock signal input to a third input terminal, a first power supply input to a first power supply input terminal and a second power supply input to a second power supply input terminal, a first output unit configured to receive a third clock signal from a fourth input terminal and the second power supply from the second power supply input terminal and to output the second scan signal to a first output terminal corresponding to the voltages of the first node and the second node, and a second output unit configured to receive a fifth clock signal from a fifth input terminal and the first power supply from the first power supply input terminal and to output the first scan signal to a second output terminal corresponding to the voltage of the second node.

A gate start pulse may be input to the first input terminal when the ith stage is set to the first stage, and otherwise, the shift pulse may be input from an (i−1)th stage.

The first clock signal, the second clock signal, the third clock signal and the fifth clock signal may have the same cycle.

The first clock signal and the second clock signal may have a duty ratio of 50%, and the second clock signal may be set to a signal obtained by inverting the first clock signal.

The third clock signal may be set to a high level during a first period of one cycle, and set to a low level during a second period wider than the first period.

A high-level period of the third clock signal may overlap a high-level period of the first clock signal.

The fifth clock signal may be set to a signal obtained by inverting the third clock signal.

The second clock signal may be input to a second input terminal, the first clock signal may be input to a third input terminal, a fourth clock signal may be input to a fourth input terminal, and a sixth clock signal may be input to a fifth input terminal of an (i+1)th stage circuit.

The fourth clock signal may be set to a high level during a first period of one cycle, and set to a low level during a second period longer than the first period.

A high-level period of the fourth clock signal may overlap a high-level period of the second clock signal.

The sixth clock signal may be set to a signal obtained by inverting the fourth clock signal.

The first power supply may be set to a gate-off voltage, and the second power supply may be set to a gate-on voltage.

The first output unit may include a first transistor connected between the fourth input terminal and the first output terminal and having a gate electrode connected to the first node, a second transistor connected between the first output terminal and the second power supply input terminal and having a gate electrode connected to the second node, and a first capacitor connected between the second node and the first output terminal.

The input unit may include a third transistor connected between the first power supply input terminal and a third node and having a gate electrode connected to the second input terminal, a fourth transistor connected between the third node and the third input terminal and having a gate electrode connected to a fourth node, a fifth transistor connected between the fourth node and the first input terminal and having a gate electrode connected to the second input terminal, a sixth transistor connected between the first power supply input terminal and the second node and having a gate electrode connected to the third node, a seventh transistor connected between the second node and the second power supply input terminal and having a gate electrode connected to the second input terminal, an eighth transistor connected between the first power supply input terminal and the first node and having a gate electrode connected to the second node, a ninth transistor connected between the first node and the second power supply input terminal and having a gate electrode connected to the third node, and a second capacitor connected between the third node and the fourth node.

A voltage of the third node or the voltage of the first node may be supplied as the shift pulse to a subsequent stage.

The second output unit may include a tenth transistor connected between the first power supply input terminal and the second output terminal and having a gate electrode connected to the second node, an eleventh transistor connected between the second output terminal and the fifth input terminal and having a gate electrode connected to a fifth node, a twelfth transistor connected between the fourth node and the fifth node and having a gate electrode connected to the fifth input terminal, a third capacitor connected between the fifth node and the second output terminal, and a fourth capacitor connected between the first power supply input terminal and the second node.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
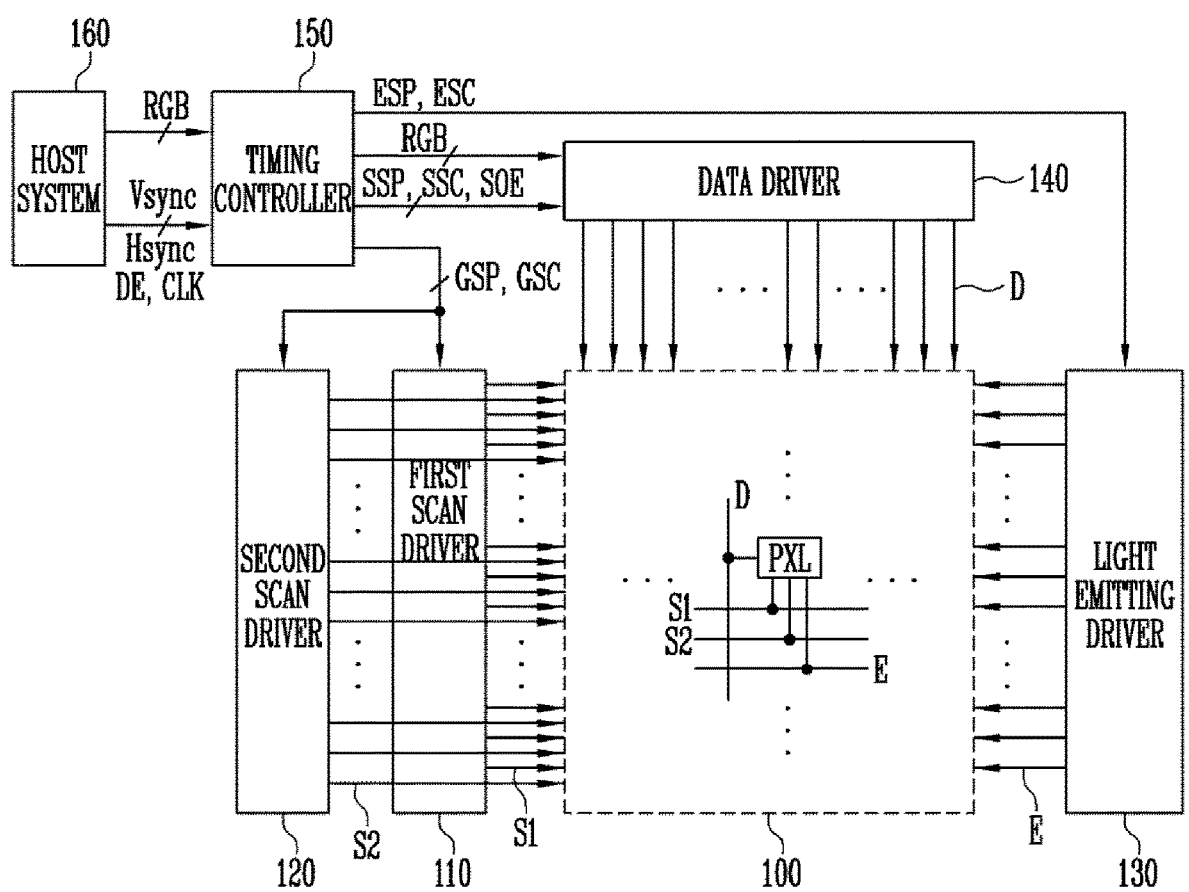
FIG. 1 is a schematic view illustrating a display device according to an exemplary embodiment of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, embodiments of the invention and any other subject matter necessary for those skilled in the art to understand the contents of the invention will be described in detail with reference to the accompanying drawings. However, the invention may be embodied in different other forms and should not be construed as being limited only to the embodiments set forth herein.

That is, the present invention is not limited to the embodiments described herein but may be embodied in other forms. It is also noted that in this specification, "coupled/coupled" refers to one component not only directly coupling another component but also indirectly coupling another component through an intermediate component. In addition, in the drawings, the same or similar constituent elements are denoted by the same reference numerals and marks as possible although shown in different drawings.

FIG. 1 is a schematic view illustrating a display device according to an exemplary embodiment of the invention.

Referring to FIG. 1, a display device according to an exemplary embodiment of the invention may include a pixel array 100, a first scan driver 110, a second scan driver 120, a light emitting driver 130, a data driver 140, a timing controller 150 and a host system 160.

The pixel array 100 may include a plurality of pixels PXL connected to data lines D, first scan lines S1, second scan lines S2, and light emitting control lines E. Each of the pixels PXL may emit light of a predetermined luminance corresponding to a data signal.

Each of the pixels PXL may include a plurality of transistors including a driving transistor (not shown) and an organic light emitting diode (not shown). The pixel PXL may receive the data signal from the data line D corresponding to a first scan signal supplied to the first scan line S1 and/or a second scan signal supplied to the second scan line S2. After the data signal is supplied, the driving transistor may supply a current corresponding to the data signal to the organic light emitting diode, so that light of a predetermined luminance may be generated from the organic light emitting diode. A light emission time of the pixel PXL may be controlled in response to a light emitting control signal supplied to the light emitting control line E.

In addition, the pixel PXL may include an N-type transistor (e.g., an NMOS transistor) and a P-type transistor (e.g., a PMOS transistor). For example, the pixel PXL may be embodied as various forms of circuits to include the N-type and P-type transistors.

The data driver 140 may generate the data signal by using image data RGB input from the timing controller 150. Data signals generated by the data driver 140 may be supplied to the data lines D. The data driver 140 may be embodied as various forms of circuits currently known in the art.

The first scan driver 110 may supply first scan signals to the first scan lines S1. For example, the first scan driver 110 may sequentially supply the first scan signals to the first scan lines S1. When the first scan signals are sequentially supplied to the first scan lines S1, the P-type transistors included in the respective pixels PXL may be sequentially turned on in a horizontal line. The first scan signal may be set to a gate-on voltage (e.g., a low voltage) so that the P-type transistor may be turned on. The first scan driver 110 may be embodied as various forms of circuits currently known in the art.

The second scan driver 120 may supply second scan signals to the second scan lines S2. For example, the second scan driver 120 may sequentially supply the second scan signals to the second scan lines S2. When the second scan signals are sequentially supplied to the second scan lines S2, the N-type transistors included in the respective pixels PXL may be sequentially turned on in a horizontal line. The second scan signal may be set to a gate-on voltage (e.g., a high voltage) so that the N-type transistor may be turned on. A detailed description of the structure of the second scan driver 120 will be given below.

Additionally, when the first scan signals and the second scan signals are sequentially supplied, the pixels PXL may be selected in a horizontal line, and the selected pixels PXL may be supplied with the data signals. The first scan driver 110 and/or the second scan driver 120 may be mounted on a panel. That is, the first scan driver 110 and/or the second scan driver 120 may be mounted on a substrate by performing a thin film process.

The light emitting driver 130 may supply light emitting control signals to the light emitting control lines E. For example, the light emitting driver 130 may sequentially supply the light emitting control signals to the light emitting control lines E. When the light emitting control signals are sequentially supplied, the pixels PXL may be sequentially set to a non-emission state. The light emitting control signal may be set to a gate-off voltage so that the transistors included in the respective pixels PXL may be turned off. The light emitting driver 130 may be embodied as the various formed of circuits currently known in the art.

The timing controller 150 may supply gate control signals to the scan drivers 110 and 120 based on the image data RGB and timing signals, such as a vertical synchronization signal Vsync, a horizontal synchronization signal Hsync, a data enable signal DE, a clock signal CLK and the like output from the host system 160, and supply a data control signal to the data driver 140. Further, the timing controller 150 may supply the light emitting control signal to the light emitting driver 130.

The gate control signal may include at least one gate start pulse GSP and at least one gate shift clock GSC. The gate start pulse GSP and the gate shift clock GSC may be supplied to each of the first scan driver 110 and the second scan driver 120 in the same way or in different ways.

The gate start pulse GSP may control a start point of the first scan signal and/or the second scan signal. The gate shift clock GSC may refer to at least one clock signal for shifting the gate start pulse GSP.

The light emitting control signal may include an emission start pulse ESP and at least one emission shift clock ESC. The emission start pulse ESP may control a start point of the light emitting control signal. The emission shift clock ESC may refer to at least one clock signal for shifting the emission start pulse ESP.

The data control signal may include a source start pulse SSP, a source sampling clock SSC, and a source output enable signal SOE. The source start pulse SSP may control a data sampling start point of the data driver 140. The source sampling clock SSC may control a sampling operation of the data driver 140 based on a rising edge or a falling edge. The source output enable signal SOE may control output timing of the data driver 140.

The host system 160 may supply the image data RGB to the timing controller 150 through a predetermined interface. In addition, the host system 160 may supply the timing signals, such as the vertical synchronization signal Vsync, the horizontal synchronization signal Hsync, the data enable signal DE, and the clock signal CLK to the timing controller 150.

Figure 2:
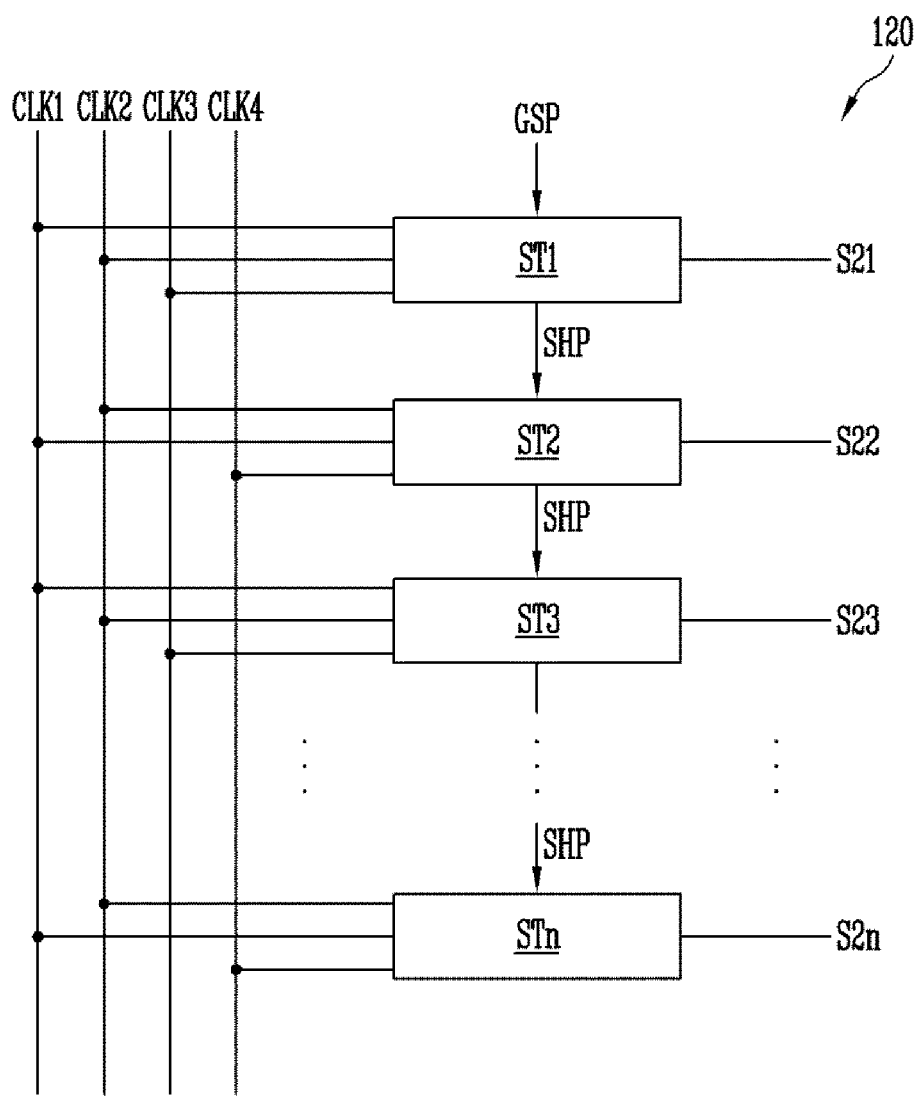
FIG. 2 is a schematic view illustrating a second scan driver shown in FIG. 1.

FIG. 2 is a schematic view illustrating a second scan driver shown in FIG. 1. In FIG. 2, it is assumed that n (n is a natural number) stages ST are included in the second scan driver 120.

Referring to FIG. 2, the second scan driver 120 according to an exemplary embodiment of the invention may include a plurality of stages ST1 to STn. Each of the stages ST1 to STn may be connected to one of second scan lines S21 to S2n. The stages ST1 to STn may supply the second scan signals to the second scan lines S21 to S2n corresponding to the gate start pulse GSP. An ith (i is a natural number equal to or greater than 1 and equal to or less than n) stage STi may be connected to an ith second scan line S2i to supply the second scan signal to the ith second scan line S2i.

The first stage ST1 may supply the second scan signal to the second scan line S21 connected thereto in response to the gate start pulse GSP. Each of the remaining stages ST2 to STn may supply the second scan signal to the second scan line S2 connected thereto in response to a shift pulse SHP supplied from a previous stage. For example, the ith stage STi may supply the second scan signal to the second scan line S2i connected thereto in response to the shift pulse SHP supplied from an (i−1)th stage STi−1 or the gate start pulse GSP.

Each of the stages ST1 to STn may receive three clock signals, among first, second, third and fourth clock signals CLK1, CLK2, CLK3, and CLK4 supplied to the second scan driver 120.

For example, each of the odd-numbered stages ST1, ST3, . . . may be supplied with the first clock signal CLK1, the second clock signal CLK2 and the third clock signal CLK3, and each of the even-numbered stages ST2, ST4, . . . may be supplied with the first clock signal CLK1, the second clock signal CLK2 and the fourth clock signal CLK4. That is, the third clock signal CLK3 may be supplied to each of the odd-numbered stages ST1, ST3, . . . and the fourth clock signal CLK4 may be supplied to each of the even-numbered stages ST2, ST4, . . . .

Figure 5:
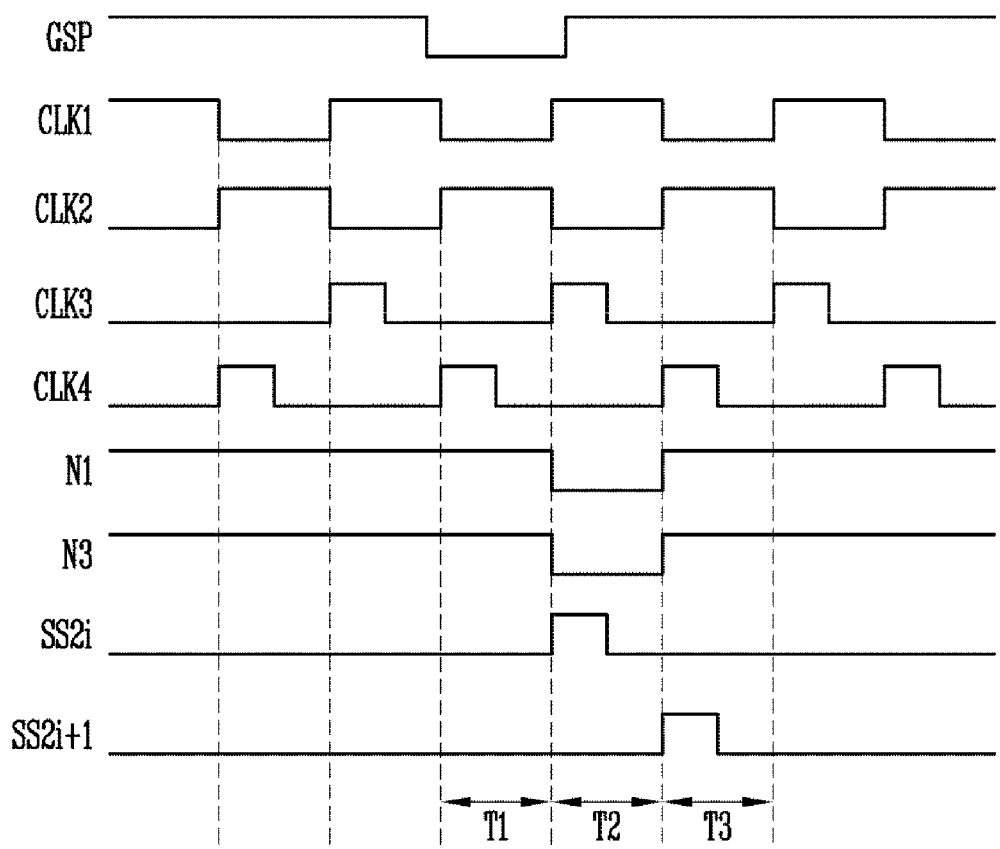
FIG. 5 is a waveform view illustrating an operation process of a stage shown in FIG. 4.

The first clock signal CLK1 to the fourth clock signal CLK4 may be square wave signals in each of which a high level and a low level are repeated, as shown in FIG. 5, and may be set to have the same period.

Each of the first clock signal CLK1 and the second clock signal CLK2 may be set to have a cycle of two (2) horizontal periods 2H. The first clock signal CLK1 may be set so that the high level and the low level may have the same width during one cycle. For example, the first clock signal CLK1 may be set to a high-level voltage during a first horizontal period of the one cycle and to a low-level voltage during a second horizontal period thereof (i.e., a duty ratio may be set to 50%). The second clock signal CLK2 may be set to a signal obtained by inverting the first clock signal CLK1.

Each of the third clock signal CLK3 and the fourth clock signal CLK4 may be set to have a cycle of two (2) horizontal periods 2H. The third clock signal CLK3 may be set so that a high level and a low level may have different widths during one cycle. For example, the third clock signal CLK3 may be set to a high-level voltage during a tenth period of the one cycle and to a low-level voltage during an eleventh period, except for the tenth period. The eleventh period may be set to be wider than the tenth period. The high level of the third clock signal CLK3 may overlap the high level of the first clock signal CLK1.

The fourth clock signal CLK4 may be set so that a high level and a low level may have different widths during the one cycle. For example, the fourth clock signal CLK4 may be set to a high-level voltage during the tenth period of the one cycle and to a low-level voltage during the eleventh period, except for the tenth period. In addition, the high level of the fourth clock signal CLK4 may overlap the high level of the second clock signal CLK2.

Figure 3:
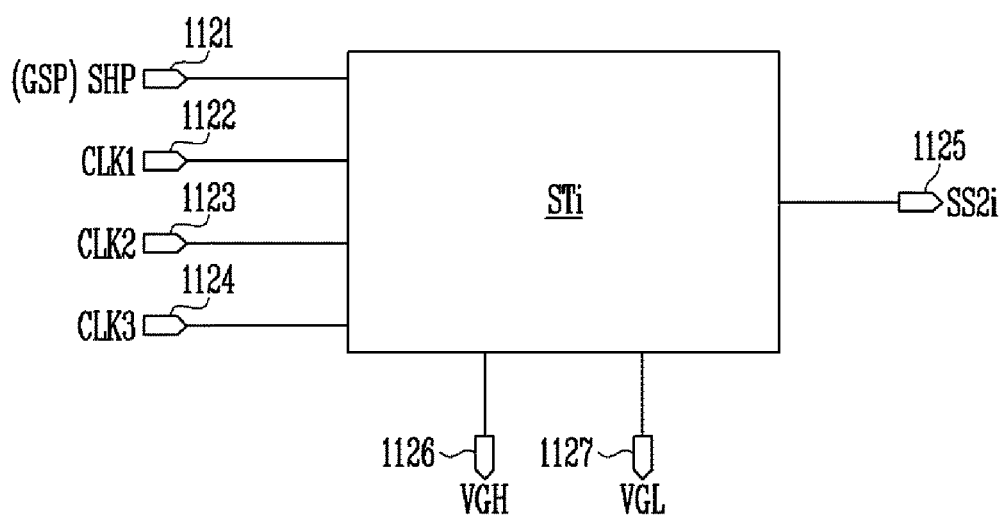
FIG. 3 is a view showing an exemplary embodiment of a connection terminal of a stage shown in FIG. 2.

FIG. 3 is a view showing an exemplary embodiment of a connection terminal of a stage shown in FIG. 2. For convenience of explanation, FIG. 3 shows the ith stage STi.

Referring to FIG. 3, the ith stage STi according to an exemplary embodiment of the invention may include a first input terminal 1121, a second input terminal 1122, a third input terminal 1123, a fourth input terminal 1124, a first output terminal 1125, a first power supply input terminal 1126, and a second power supply input terminal 1127.

The first input terminal 1121 may receive the shift pulse SHP from the (i–1)th stage STi–1. When the ith stage STi is set to the first stage ST1, the first input terminal 1121 may receive the gate start pulse GSP.

The second input terminal 1122 may receive the first clock signal CLK1. In this case, the second clock signal CLK2 may be supplied to the second input terminal 1122 of the (i–1)th stage STi–1.

The third input terminal 1123 may receive the second clock signal CLK2. In this case, the first clock signal CLK1 may be supplied to the third input terminal 1123 of the (i–1)th stage STi–1.

That is, the first clock signal CLK1 may be supplied to the second input terminal 1122 of each of the odd-numbered stages ST1, ST3, . . . ; the second clock signal CLK2 may be supplied to the third input terminal 1123 thereof; the second clock signal CLK2 may be supplied to the second input terminal 1122 of each of the even-numbered stages ST2, ST4, . . . ; and the first clock signal CLK1 may be supplied to the third input terminal 1123 thereof.

The fourth input terminal 1124 may be supplied with the third clock signal CLK3. In this case, the fourth clock signal CLK4 may be supplied to the fourth input terminal 1124 of the (i–1)th stage STi–1.

The first output terminal 1125 may output a second scan signal SS2$i$ of the ith stage STi. The second scan signal SS2$i$ output to the first output terminal 1125 may be supplied to the ith second scan line S2$i$.

The first power supply input terminal 1126 may be connected to a first power supply VGH, and the second power supply input terminal 1127 may be connected to a second power supply VGL. The first power supply VGH may be set to a gate-off voltage, and the second power supply VGL may be set to a gate-on voltage. The gate-off voltage may refer to a voltage which turns off the transistor included in the ith stage STi, and the gate-on voltage may refer to a voltage which turns on the transistor included in the ith stage STi. The first power supply VGH may be set to a higher voltage than the second power supply VGL.

Further, in an exemplary embodiment of the invention, the high level of each of the first to fourth clock signals CLK1 to CLK4 may be set to a gate-off voltage (e.g., the first power supply VGH), and the low level thereof may be set to a gate-on voltage (e.g., the second power supply VGL).

Figure 4:
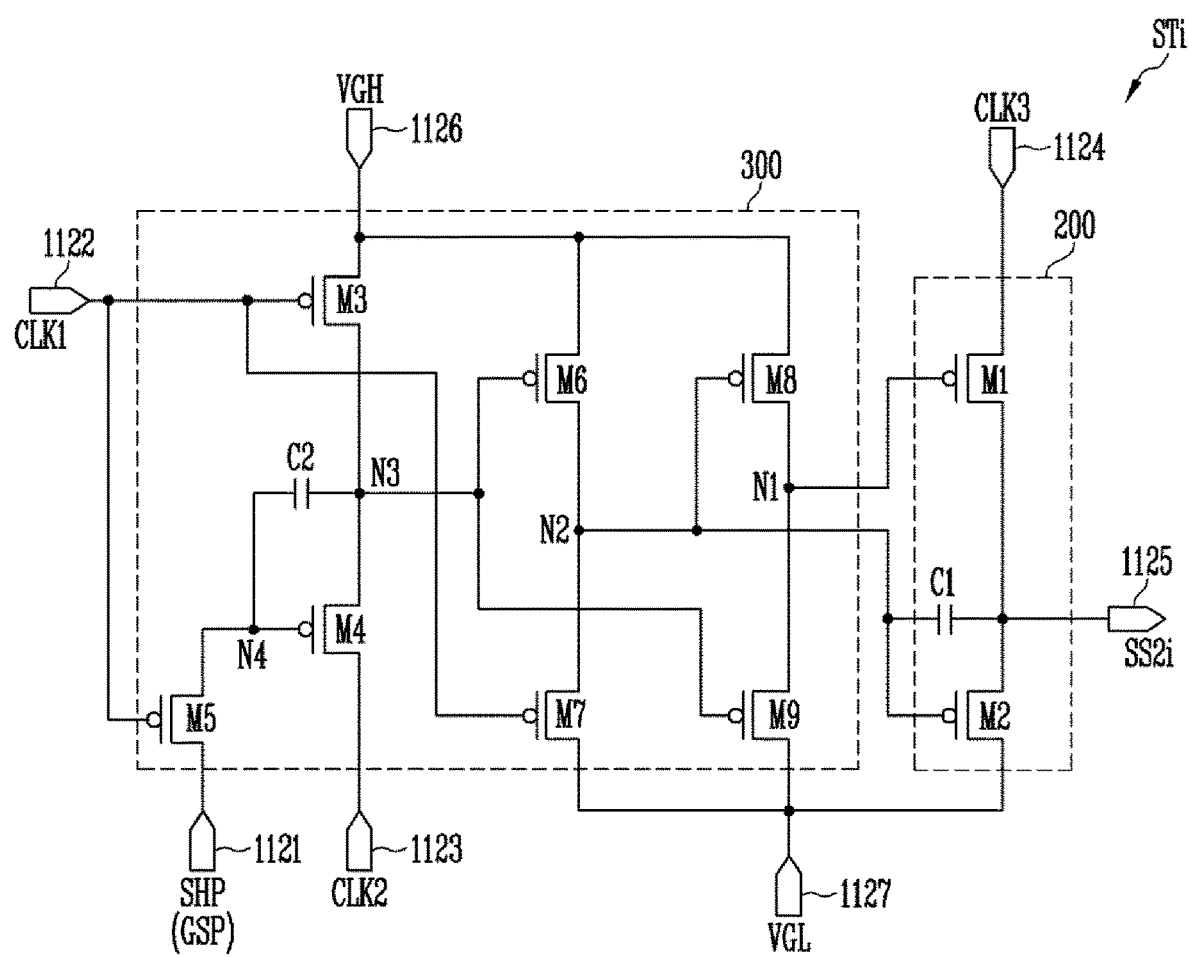
FIG. 4 is a circuit view illustrating an exemplary embodiment of an ith stage shown in FIG. 3.

FIG. 4 is a circuit view illustrating an exemplary embodiment of the ith stage STi shown in FIG. 3. For convenience of explanation, it is assumed that the first clock signal CLK1 and the second clock signal CLK2 are supplied when set to a low level, and the third clock signal CLK3 and the fourth clock signal CLK4 are supplied when set to a high level. It is also assumed that the gate start pulse GSP and the shift pulse SHP are also supplied when set to the low level.

Referring to FIG. 4, the stage STi according to an exemplary embodiment of the invention may include an input unit 300 and a first output unit 200.

The first output unit 200 may be connected to a first node N1, a second node N2, the fourth input terminal 1124 and the second power supply input terminal 1127. The first output unit 200 may supply the second scan signal SS2$i$ to the first output terminal 1125 corresponding to voltages of the first node N1 and the second node N2. The first output unit 200 may include a first transistor M1, a second transistor M2, and a first capacitor C1.

A first electrode of the first transistor M1 may be connected to the fourth input terminal 1124, and a second electrode thereof may be connected to the first output terminal 1125. In addition, a gate electrode of the first transistor M1 may be connected to the first node N1. The first transistor M1 may control an electrical connection between the fourth input terminal 1124 and the first output terminal 1125 corresponding to the voltage of the first node N1.

A first electrode of the second transistor M2 may be connected to the first output terminal 1125, and a second electrode thereof may be connected to the second power supply input terminal 1127. In addition, a gate electrode of the second transistor M2 may be connected to the second node N2. The second transistor M2 may control an electrical connection between the first output terminal 1125 and the second power supply input terminal 1127 corresponding to the voltage of the second node N2.

The first capacitor C1 may be connected between the second node N2 and the first output terminal 1125. The first capacitor C1 may store a voltage between the second node N2 and the first output terminal 1125.

The input unit 300 may be connected to the first input terminal 1121, the second input terminal 1122, the third input terminal 1123, the first power supply input terminal 1126 and the second power supply input terminal 1127. The input unit 300 may control the voltages of the first node N1 and the second node N2. The input unit 300 may include third, fourth, fifth, sixth, seventh, eighth, and ninth transistors M3, M4, M5, M6, M7, M8, and M9, and a second capacitor C2.

A first electrode of the third transistor M3 may be connected to the first power supply input terminal 1126, and a second electrode thereof may be connected to a third node N3. In addition, a gate electrode of the third transistor M3 may be connected to the second input terminal 1122. The third transistor M3 may be turned on when the first clock signal CLK1 is supplied to the second input terminal 1122 to electrically connect the first power supply input terminal 1126 and the third node N3 to each other.

A first electrode of the fourth transistor M4 may be connected to the third node N3, and a second electrode thereof may be connected to the third input terminal 1123. In addition, a gate electrode of the fourth transistor M4 may be connected to a fourth node N4. The fourth transistor M4 may control an electrical connection between the third node N3 and the third input terminal 1123 corresponding to the voltage of the fourth node N4.

A first electrode of the fifth transistor M5 may be connected to the fourth node N4 and a second electrode thereof may be connected to the first input terminal 1121. In addition, a gate electrode of the fifth transistor M5 may be connected to the second input terminal 1122. The fifth transistor M5 may be turned on when the first clock signal CLK1 is supplied to the second input terminal 1122 to electrically connect the fourth node N4 and the first input terminal 1121 to each other.

A first electrode of the sixth transistor M6 may be connected to the first power supply input terminal 1126, and a second electrode thereof may be connected to the second node N2. In addition, a gate electrode of the sixth transistor M6 may be connected to the third node N3. The sixth transistor M6 may control an electrical connection between the first power supply input terminal 1126 and the second node N2 corresponding to the voltage of the third node N3.

A first electrode of the seventh transistor M7 may be connected to the second node N2 and a second electrode thereof may be connected to the second power supply input terminal 1127. In addition, a gate electrode of the seventh transistor M7 may be connected to the second input terminal 1122. The seventh transistor M7 may be turned on when the first clock signal CLK1 is supplied to the second input terminal 1122 to control an electrical connection between the second node N2 and the second power supply input terminal 1127. In addition, the seventh transistor M7 may maintain a turn-off state even though the first clock signal CLK1 is supplied corresponding to the voltage of the second node N2. A detailed description thereof will be given below.

A first electrode of the eighth transistor M8 may be connected to the first power supply input terminal 1126, and a second electrode thereof may be connected to the first node N1. In addition, a gate electrode of the eighth transistor M8 may be connected to the second node N2. The eighth transistor M8 may control an electrical connection between the first power supply input terminal 1126 and the first node N1 corresponding to the voltage of the second node N2.

A first electrode of the ninth transistor M9 may be connected to the first node N1 and a second electrode thereof may be connected to the second power input terminal 1127.

In addition, a gate electrode of the ninth transistor M9 may be connected to the third node N3. The ninth transistor M9 may control an electrical connection between the first node N1 and the second power supply input terminal 1127 corresponding to the voltage of the third node N3.

The second capacitor C2 may be connected between the third node N3 and the fourth node N4. The second capacitor C2 may store a voltage between the third node N3 and the fourth node N4.

Figure 6:
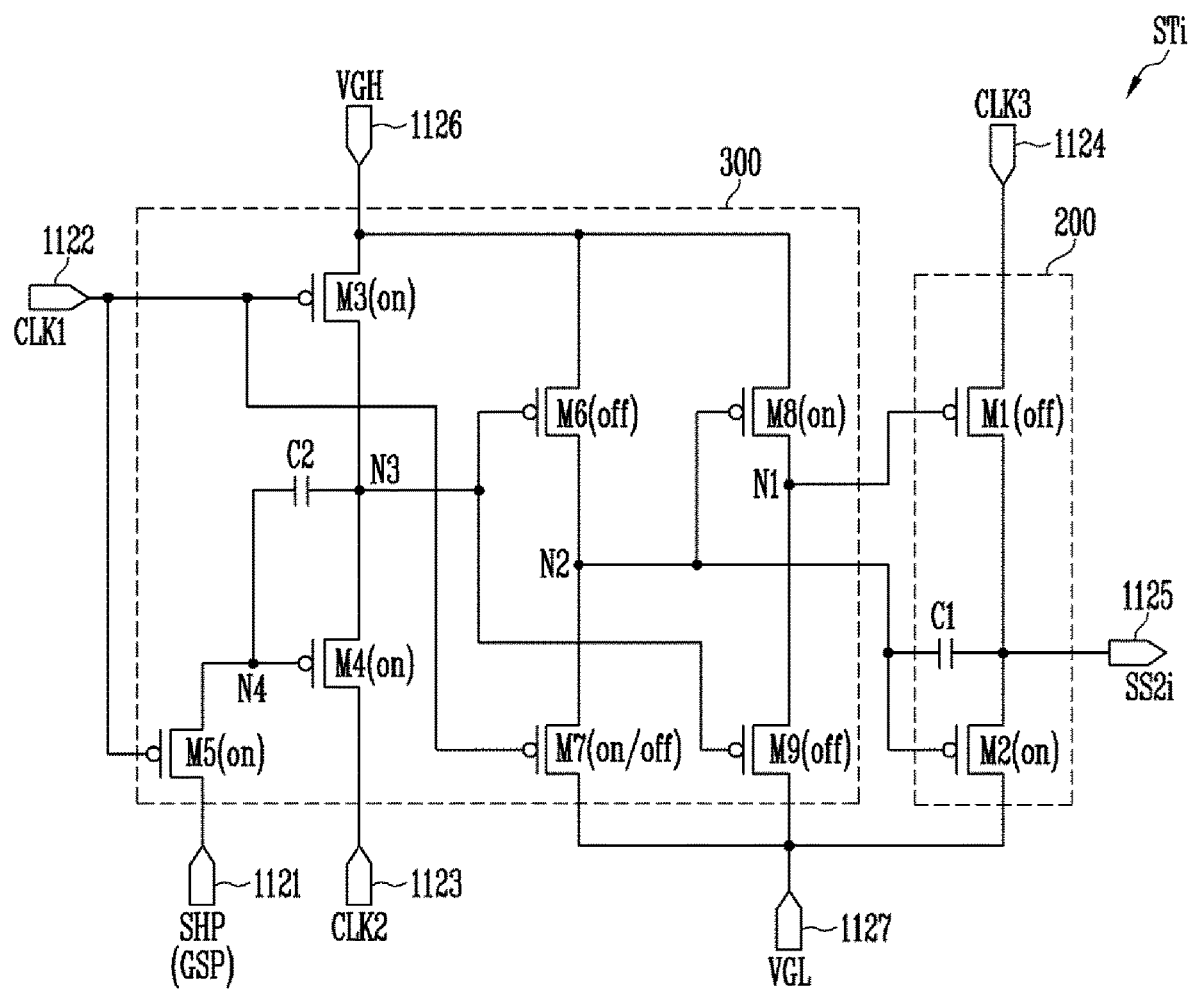
FIG. 6, FIG. 7, and FIG. 8 are views illustrating an operation process of a stage corresponding to the waveform view of FIG. 5.
Figure 7:
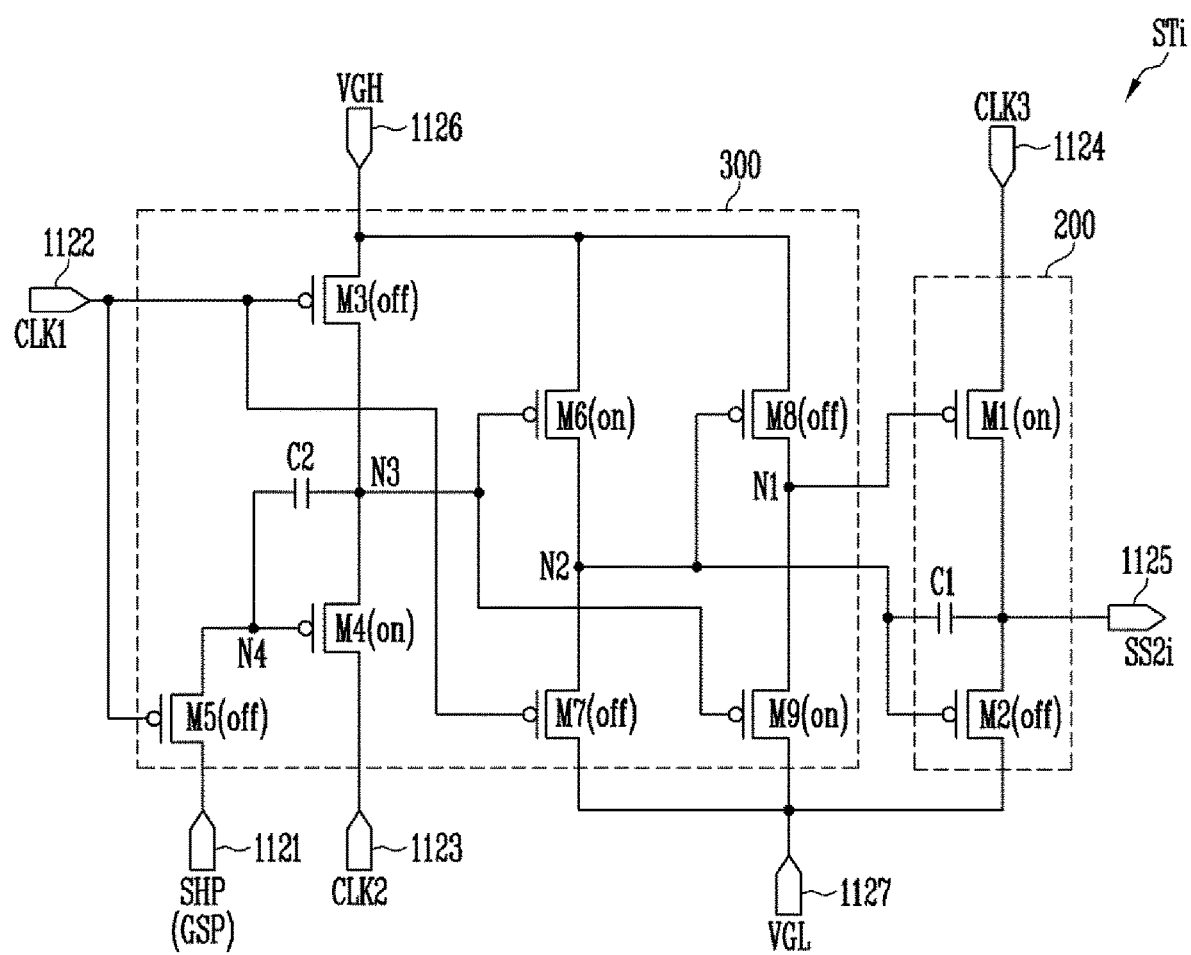
Figure 8:
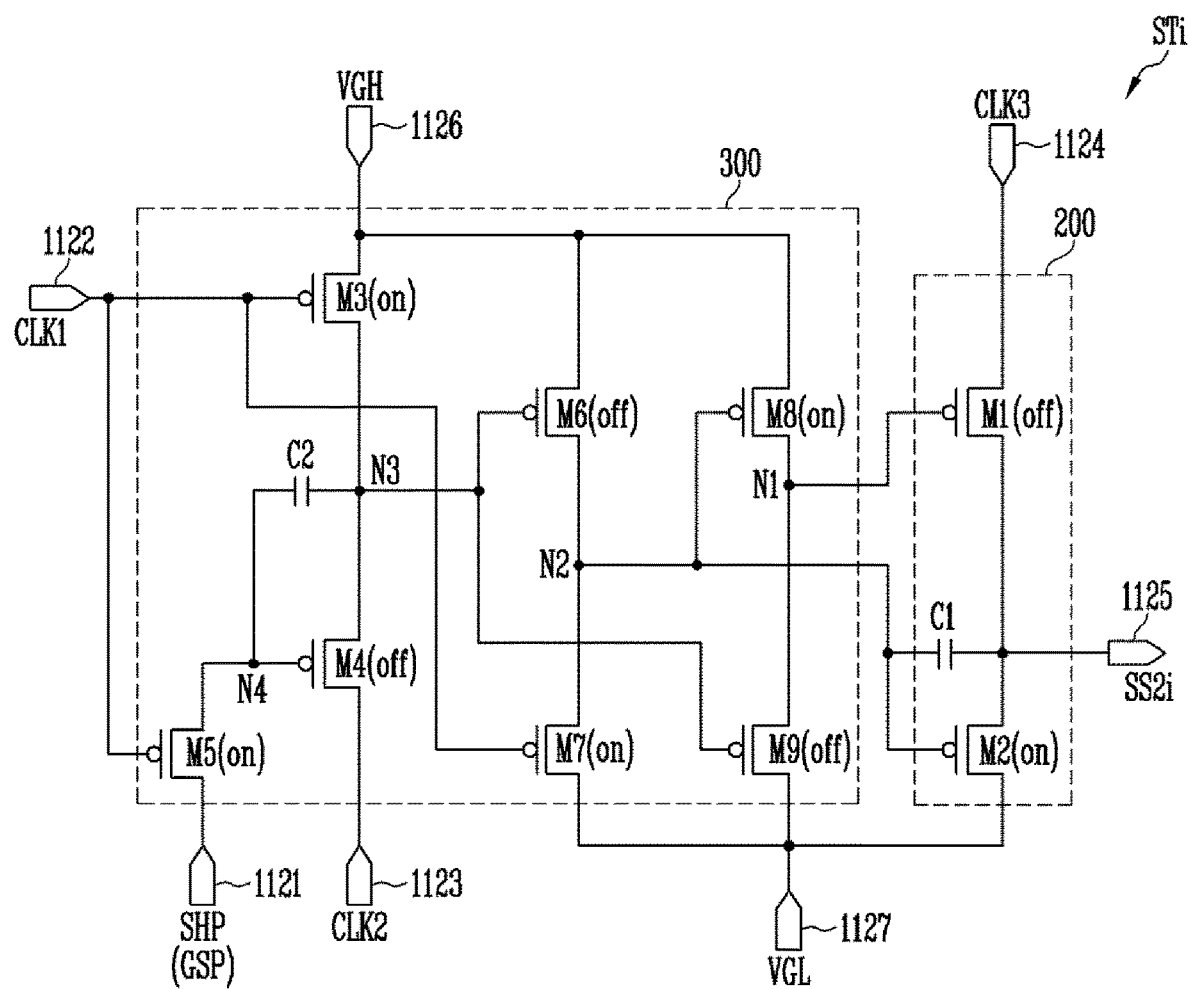

FIG. 5 is a waveform view illustrating an operation process of a stage shown in FIG. 4. In addition, FIGS. 6 to 8 are views illustrating an operation process of a stage corresponding to the waveform view of FIG. 5. Hereinafter, for convenience of explanation, it is assumed that the ith stage STi is the first stage.

Referring to FIGS. 4 and 5, the gate start pulse GSP and the first clock signal CLK1 may be supplied during a first period T1 (that is, the gate start pulse GSP and the first clock signal CLK1 may be set to a low level).

When the first clock signal CLK1 is supplied, the third transistor M3 and the fifth transistor M5 may be turned on, as shown in FIG. 6. In addition, when the first clock signal CLK1 is supplied, the seventh transistor M7 may be turned on or off corresponding to the voltage of the second node N2. For example, before the first period T1, the second node N2 may be set to a voltage of the second power supply VGL, and the seventh transistor M7 may maintain the turn-off state.

When the third transistor M3 is turned on, a voltage of the first power supply VGH may be supplied to the third node N3. When the voltage of the first power supply VGH is supplied to the third node N3, the sixth transistor M6 and the ninth transistor M9 may be turned off.

When the fifth transistor M5 is turned on, the gate start pulse GSP may be supplied to the fourth node N4. When the gate start pulse GSP is supplied to the fourth node N4, the fourth transistor M4 may be turned on. The second capacitor C2 may store a voltage corresponding to the turn-on state of the fourth transistor M4.

When the fourth transistor M4 is turned on, the third input terminal 1123 and the third node N3 may be electrically connected. Since the second clock signal CLK2 is not supplied to the third input terminal 1123 (that is, a high-level voltage is supplied to the third input terminal 1123), the voltage of the third node N3 may stably maintain the voltage of the first power supply VGH.

The second node N2 may maintain a low-level voltage (e.g., the second power supply VGL) by a voltage of the first capacitor C1 charged before the first period T1. Accordingly, the eighth transistor M8 and the second transistor M2 may be turned on during the first period T1.

When the eighth transistor M8 is turned on, the voltage of the first power supply VGH is supplied to the first node N1, thereby turning off the first transistor M1. When the second transistor M2 is turned on, the voltage of the second power supply VGL may be supplied to the first output terminal 1125. Therefore, the first output terminal 1125 may maintain a low-level voltage during the first period T1 (i.e., the second scan signal SS2i may not be supplied).

The second clock signal CLK2 may be supplied during a second period T2. The third clock signal CLK3 may be supplied during a portion of the second period T2. The second clock signal CLK2 and the third clock signal CLK3 may be simultaneously supplied.

The fourth transistor M4 may maintain the turn-on state as shown in FIG. 7 corresponding to the voltage charged in the second capacitor C2 during the first period T1. Therefore, the second clock signal CLK2 supplied to the third input terminal 1123 may be supplied to the third node N3. When the second clock signal CLK2 is supplied to the third node N3, the sixth transistor M6 and the ninth transistor M9 may be turned on.

When the sixth transistor M6 is turned on, the voltage of the first power supply VGH may be supplied to the second node N2, so that the eighth transistor M8 and the second transistor M2 may be turned off. When the ninth transistor M9 is turned on, the voltage of the second power supply VGL may be supplied to the first node N1, so that the first transistor M1 may be turned on.

When the first transistor M1 is turned on, a high-level voltage of the third clock signal CLK3 supplied to the fourth input terminal 1124 may be supplied to the first output terminal 1125. The high-level voltage of the third clock signal CLK3 supplied to the first output terminal 1125 may be supplied to the second scan signal SS2i.

The first clock signal CLK1 may be supplied during a third period T3. When the first clock signal CLK1 is supplied, the third transistor M3, the fifth transistor M5 and the seventh transistor M7 may be turned on, as shown in FIG. 8.

When the third transistor M3 is turned on, the voltage of the first power supply VGH may be supplied to the third node N3. When the voltage of the first power supply VGH is supplied to the third node N3, the sixth transistor M6 and the ninth transistor M9 may be turned off.

When the fifth transistor M5 is turned on, the first input terminal 1121 and the fourth node N4 may be electrically connected. Since the gate start pulse GSP is not supplied, the first input terminal 1121 may be set to a high-level voltage, so that the fourth node N4 may also be set to the high-level voltage. When the fourth node N4 is set to the high-level voltage, the fourth transistor M4 may be turned off. The second capacitor C2 may store a voltage corresponding to the turn-off state of the fourth transistor M4.

When the seventh transistor M7 is turned on, the voltage of the second power supply VGL may be supplied to the second node N2. When the voltage of the second power supply VGL is supplied to the second node N2, the eighth transistor M8 and the second transistor M2 may be turned on.

When the eighth transistor M8 is turned on, the voltage of the first power supply VGH may be supplied to the first node N1, so that the first transistor M1 may be turned off. When the second transistor M2 is turned on, the voltage of the second power supply VGL may be supplied to the first output terminal 1125.

When the second power supply VGL is supplied to the first output terminal 1125, the voltage of the second node N2 may be lowered by coupling of the first capacitor C1, so that the second transistor M2 may stably maintain a turn-on state.

The stages according to an exemplary embodiment of the invention may supply second scan signals SS2 to the second scan lines S2 while repeating the above-described process. In addition, according to the invention, the high level of the third clock signal CLK3 (or the fourth clock signal CLK4) may be supplied as the second scan signal SS2. Therefore, the width of the second scan signal SS2 may be controlled by controlling the width of the high level of the third clock signal CLK3 (or the fourth clock signal CLK4).

Figure 9A:
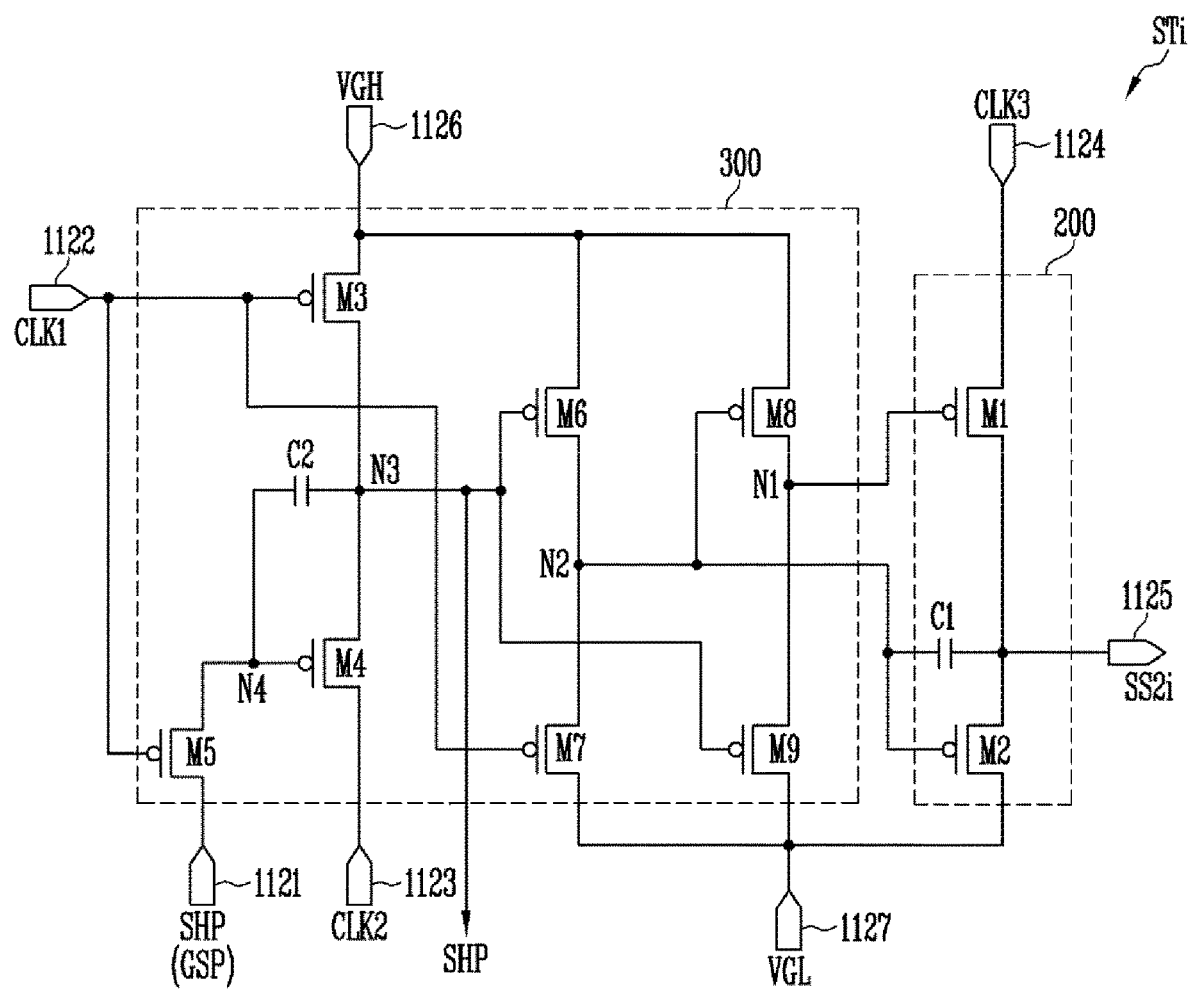
FIG. 9A and FIG. 9B are views illustrating a shift pulse output from a stage circuit shown in FIG. 4.
Figure 9B:
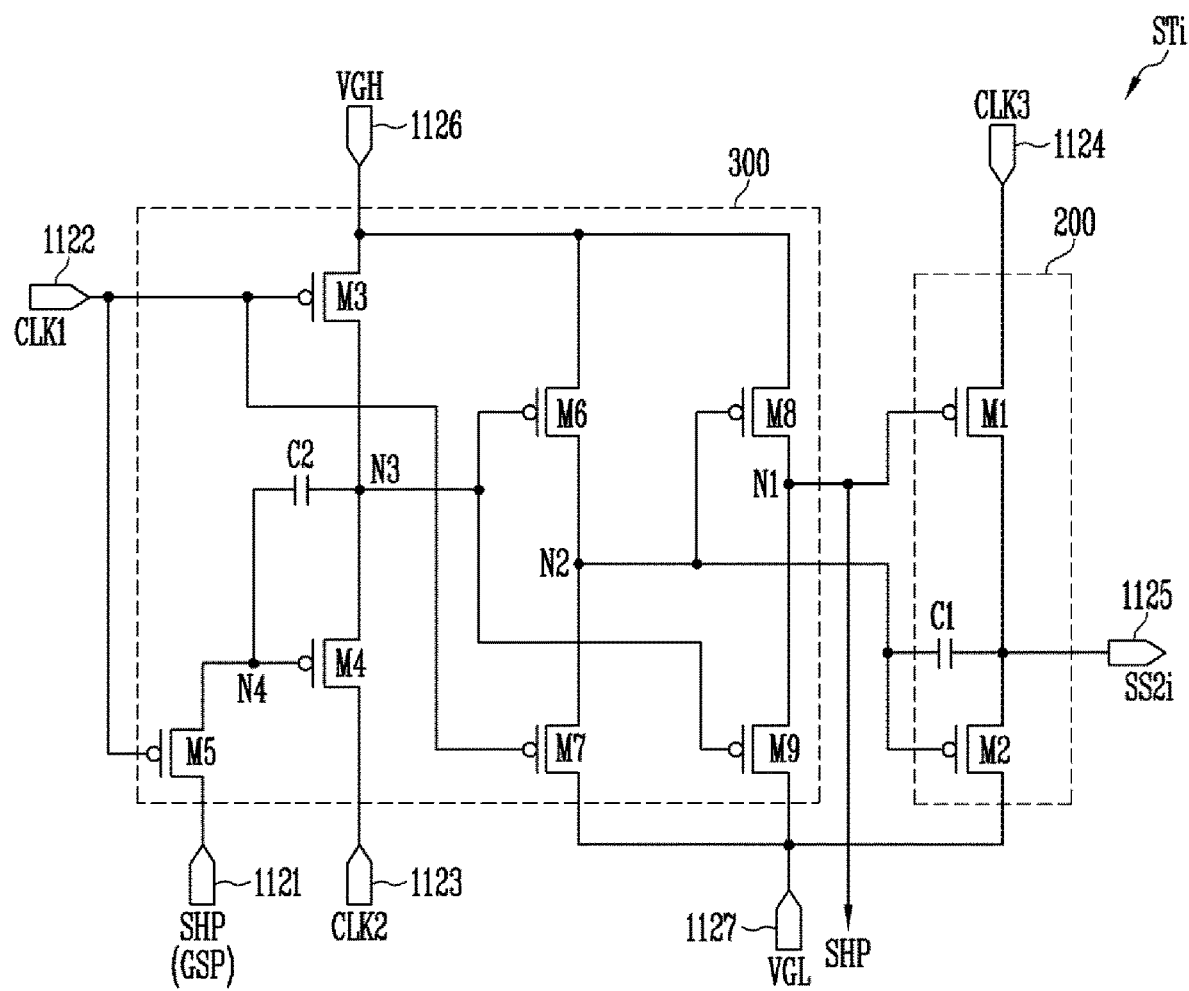

According to an exemplary embodiment of the invention, as shown in FIGS. 9A and 9B, the voltage of the first node N1 or the third node N3 may be supplied as the shift pulse SHP to a subsequent stage. An (i+1)th stage STi+1 receiving the shift pulse SHP from the ith stage STi may supply the second scan signal corresponding to the second clock signal CLK2 supplied to the second input terminal 1122, the first clock signal CLK1 supplied to the third input terminal 1123 and the fourth clock signal CLK4 supplied to the fourth input terminal 1124.

Figure 10:
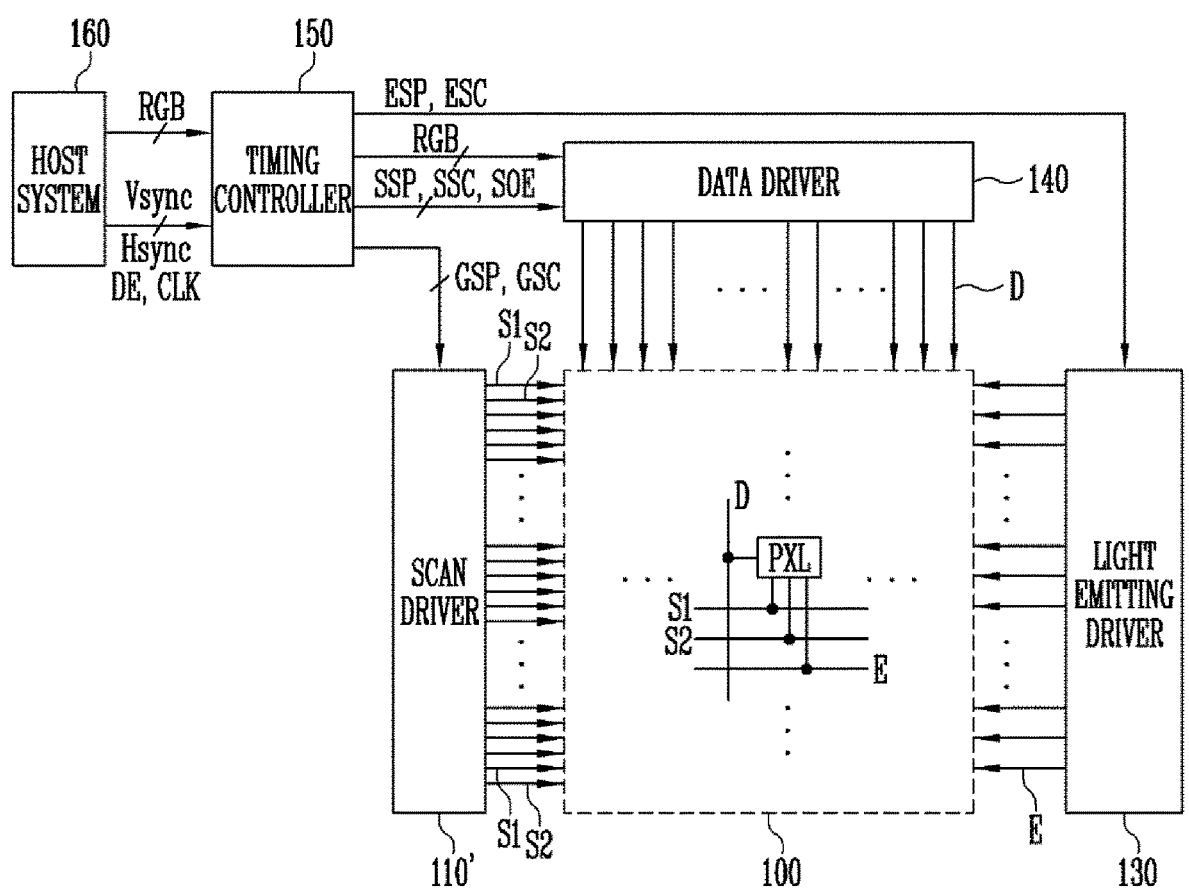
FIG. 10 is a schematic view illustrating a display device according to another exemplary embodiment of the invention.

FIG. 10 is a schematic view illustrating a display device according to another exemplary embodiment of the invention. In the description of FIG. 10, the same reference numerals will be given to the same constituents as those in FIG. 1, and a detailed description thereof will be omitted.

Referring to FIG. 10, a display device according to another exemplary embodiment of the invention may include the pixel array 100, a scan driver 110', the light emitting driver 130, the data driver 140, the timing controller 150 and the host system 160.

The scan driver 110' may supply first scan signals to the first scan lines S1 and second scan signals to the second scan lines S2. When the first scan signals are sequentially supplied to the first scan lines S1, the P-type transistors included in the respective pixels PXL may be sequentially turned on in a horizontal line. When the second scan signals are sequentially supplied to the second scan lines S2, the N-type transistors included in the respective pixels PXL may be sequentially turned on in a horizontal line.

The scan driver 110' may include a plurality of stages (not shown) for generating the first scan signals and the second scan signals. That is, in another exemplary embodiment of the invention, the stages included in the scan driver 110' may generate the first scan signals and the second scan signals, thereby minimizing a mounting area and manufacturing cost of the scan driver 110'.

Figure 11:
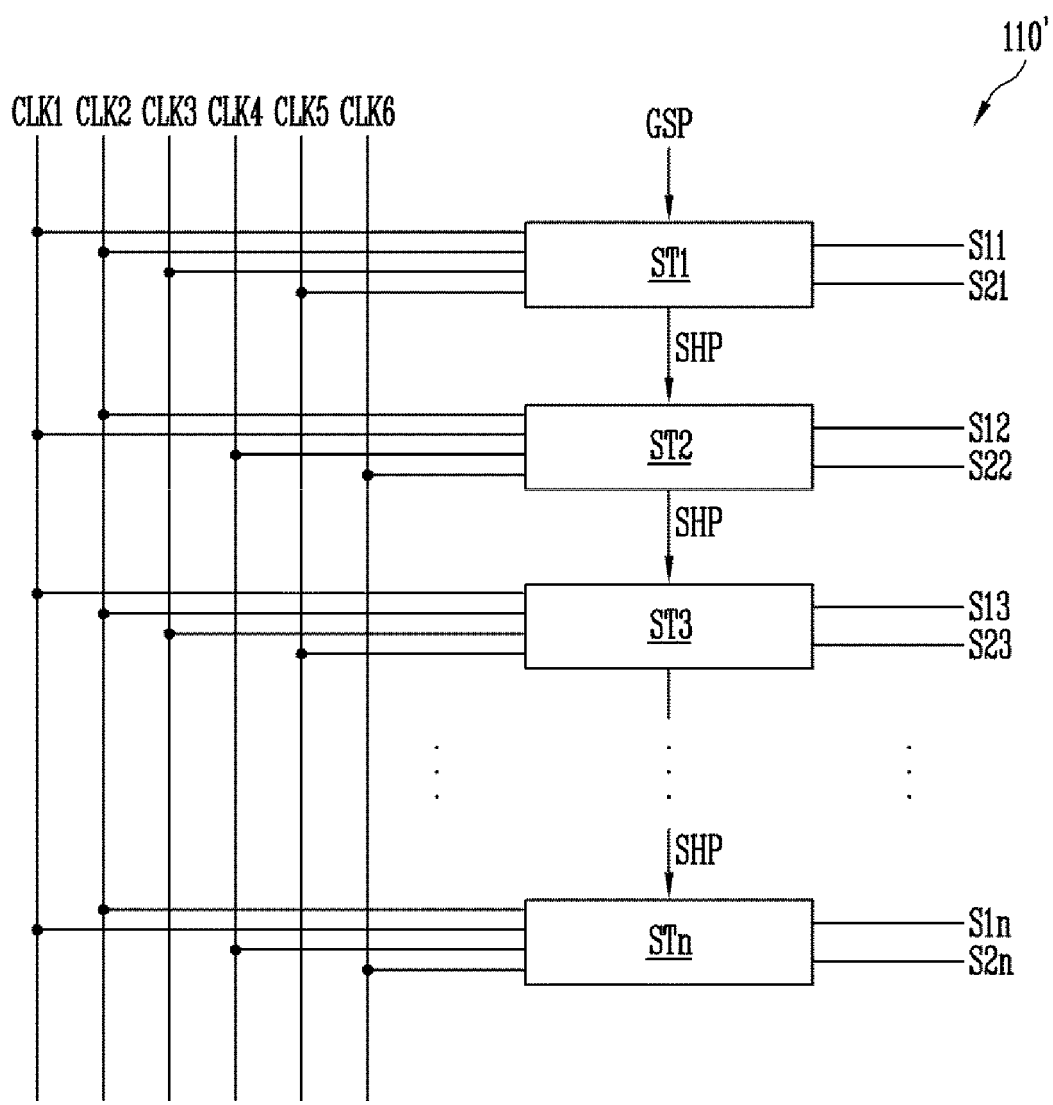
FIG. 11 is a schematic view illustrating a scan driver shown in FIG. 10.

FIG. 11 is a schematic view illustrating a scan driver shown in FIG. 10. It is assumed that n stages ST1 to STn are included in the scan driver 110' in FIG. 11.

Referring to FIG. 11, the scan driver 110' according to an exemplary embodiment of the invention may include the plurality of stages ST1 to STn. Each of the stages ST1 to STn may supply the first scan signals to first scan lines S11 to S1n and the second scan signals to the second scan lines S21 to S2n.

Additionally, FIG. 11 shows that each of the stages ST1 to STn is connected to the first scan line S1 and the second scan line S2 disposed on the same horizontal line. However, the invention is not limited thereto. For example, according to the circuit structure of the pixel PXL, the first scan line S1 and the second scan line S2 connected to the stages ST1 and STn, respectively, may be disposed on different horizontal lines.

The first stage ST1 may supply the first scan signal to the first scan line S11 connected thereto corresponding to the gate start pulse GSP and supply the second scan signal to the second scan line S21. Each of the remaining stages ST2 to STn may supply the first scan signal to the first scan line (one of the first scan lines S12 to S1n) and supply the second scan signal to the second scan line (one of the second scan lines S22 to S2n) connected thereto corresponding to the shift pulse SHP supplied from the previous stage.

Each of the stages ST1 to STn may be supplied with four clock signals, among the first, second, third, fourth, fifth and sixth clock signals CLK1, CLK2, CLK3, CLK4, CLK5, and CLK6 supplied to the scan driver 110'.

For example, each of the odd-numbered stages ST1, ST3, . . . may be supplied with the first clock signal CLK1, the second clock signal CLK2, the third clock signal CLK3 and the fifth clock signal CLK5, and each of the even-numbered stages ST2, ST4, . . . may be supplied with the first clock signal CLK1, the second clock signal CLK2, the fourth clock signal CLK4 and the sixth clock signal CLK6. That is, the third clock signal CLK3 and the fifth clock signal CLK5 may be supplied to each of the odd-numbered stages ST1, ST3, . . . , and the fourth clock signal CLK4 and the sixth clock signal CLK6 may be supplied to each of the even-numbered stages ST2, ST4, . . . .

Figure 14:
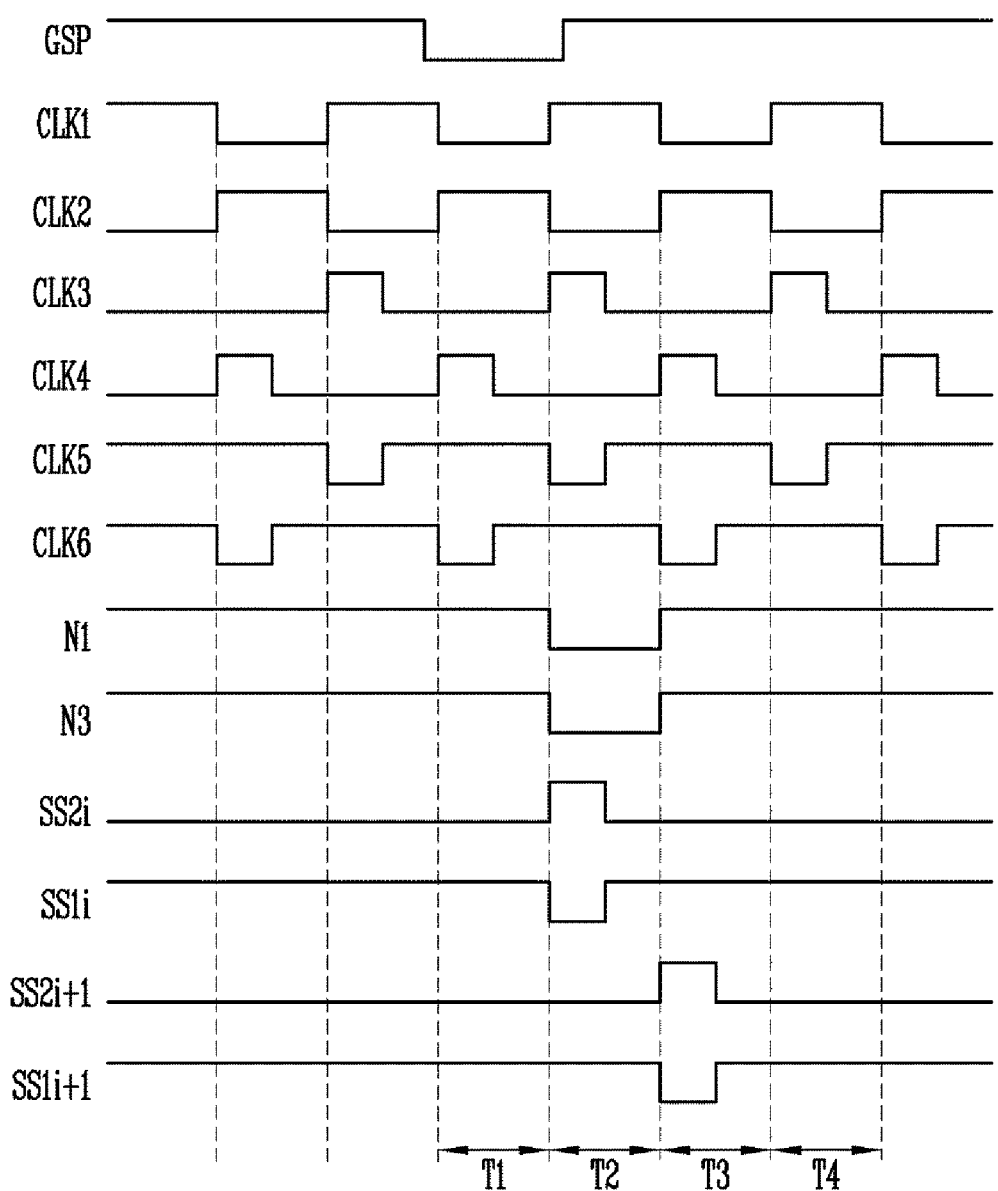
FIG. 14 is a waveform view illustrating an operation process of a stage shown in FIG. 13.

The first clock signal CLK1 to the sixth clock signal CLK6 may be square wave signals in each of which a high level and a low level are repeated as shown in FIG. 14, and may be set to have the same period.

Each of the first clock signal CLK1 and the second clock signal CLK2 may be set to have a cycle of two (2) horizontal periods 2H. The first clock signal CLK1 may be set so that the high level and the low level may have the same width during one cycle. For example, the first clock signal CLK1 may be set to a high-level voltage during a first horizontal period of the one cycle and to a low-level voltage during a second horizontal period thereof. The second clock signal CLK2 may be set to a signal obtained by inverting the first clock signal CLK1.

Each of the third clock signal CLK3 and the fourth clock signal CLK4 may be set to have a cycle of two (2) horizontal periods 2H. The third clock signal CLK3 may be set so that the high level and the low level may have different widths for one cycle. For example, the third clock signal CLK3 may be set to a high-level voltage during a tenth period of the one cycle and to a low-level voltage during an eleventh period thereof, except for the tenth period. The eleventh period may be set to be wider than the tenth period. The high level of the third clock signal CLK3 may overlap the high level of the first clock signal CLK1. The fifth clock signal CLK5 may be set to a signal obtained by inverting the third clock CLK3.

The fourth clock signal CLK4 may be set so that the high level and the low level may have different widths for a period of one cycle. For example, the fourth clock signal CLK4 may be set to a high-level voltage during the tenth period of the one cycle and to a low-level voltage during the eleventh period thereof, except for the tenth period. In addition, the high level of the fourth clock signal CLK4 may overlap the high level of the second clock signal CLK2. The sixth clock signal CLK6 may be set to a signal obtained by inverting the fourth clock signal CLK4.

Figure 12:
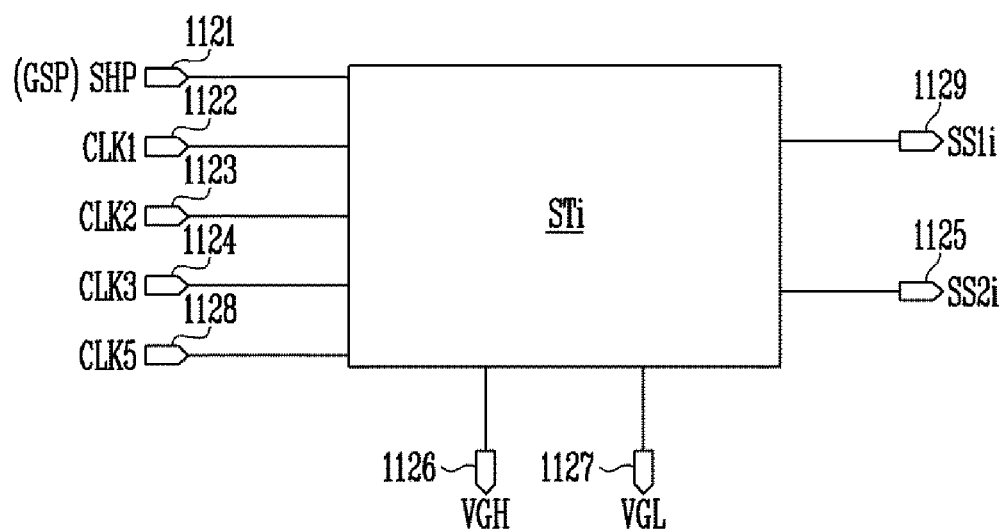
FIG. 12 is a view showing an exemplary embodiment of a connection terminal of a stage shown in FIG. 11.

FIG. 12 is a view showing an exemplary embodiment of a connection terminal of a stage shown in FIG. 11. For convenience of explanation, FIG. 12 shows the ith stage STi. In addition, in the description of FIG. 12, the same reference numerals will be given to the same constituents as those in FIG. 3.

Referring to FIG. 12, the stage STi according to an exemplary embodiment of the invention may include the first input terminal 1121, the second input terminal 1122, the third input terminal 1123, the fourth input terminal 1124, a fifth input terminal 1128, the first output terminal 1125, a second output terminal 1129, the first power supply input terminal 1126 and the second power supply input terminal 1127.

The first input terminal 1121 may be supplied with the shift pulse SHP from the (i−1)th stage STi−1. When the ith stage STi is set to the first stage ST1, the first input terminal 1121 may be supplied with the gate start pulse GSP.

The second input terminal 1122 may be supplied with the first clock signal CLK1. In this case, the second clock signal CLK2 may be supplied to the second input terminal 1122 of the (i−1)th stage STi−1.

The third input terminal 1123 may be supplied with the second clock signal CLK2. In this case, the first clock signal CLK1 may be supplied to the third input terminal 1123 of the (i−1)th stage STi−1.

That is, the first clock signal CLK1 may be supplied to the second input terminal 1122 of each of the odd-numbered stages ST1, ST3, . . . and the second clock signal CLK2 may be supplied to the third input terminal 1123 thereof. The second clock signal CLK2 may be supplied to the second input terminal 1122 of each of the even-numbered stages ST2, ST4, . . . and the first clock signal CLK1 may be supplied to the third input terminal 1123 thereof.

The fourth input terminal 1124 may be supplied with the third clock signal CLK3. In this case, the fourth clock signal CLK4 may be supplied to the fourth input terminal 1124 of the (i−1)th stage STi−1.

The fifth input terminal 1128 may be supplied with the fifth clock signal CLK5. In this case, the sixth clock signal CLK6 may be supplied to the fifth input terminal 1128 of the (i−1)th stage STi−1.

The first output terminal 1125 may output the second scan signal SS2i of the ith stage STi.

The second output terminal 1129 may output a first scan signal SS1i of the ith stage STi.

The first power supply input terminal 1126 may be connected to the first power supply VGH and the second power input terminal 1127 may be connected to the second power supply VGL.

Figure 13:
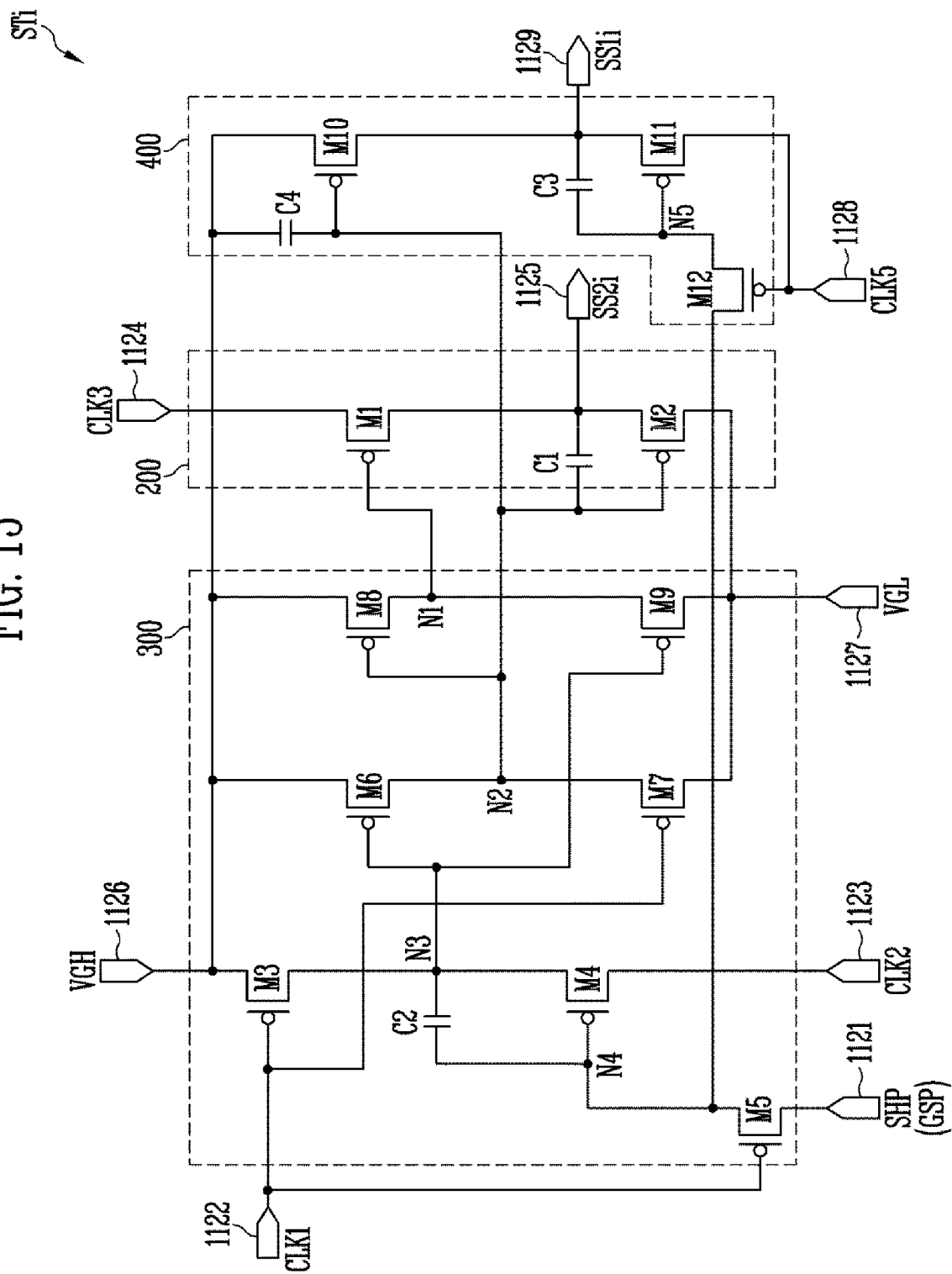
FIG. 13 is a circuit view illustrating an exemplary embodiment of an ith stage shown in FIG. 12.

FIG. 13 is a circuit view illustrating an exemplary embodiment of the ith stage shown STi in FIG. 12. In the description of FIG. 13, the same reference numerals will be given to the same constituents as those in FIG. 14, and a detailed description thereof will be omitted.

Referring to FIG. 13, the ith stage STi according to an exemplary embodiment of the invention may include the input unit 300, the first output unit 200, and a second output unit 400.

The second output unit 400 may be connected to the first power supply input terminal 1126, the fifth input terminal 1128, the second node N2 and the fourth node N4. The second output unit 400 may supply the first scan signal SS1i to the second output terminal 1129 corresponding to the fifth clock signal CLK5 supplied to the fifth input terminal 1128 and the voltage of the second node N2. The second output unit 400 may include a tenth transistor M10, an eleventh transistor M11, a twelfth transistor M12, a third capacitor C3, and a fourth capacitor C4.

A first electrode of the tenth transistor M10 may be connected to the first power supply input terminal 1126 and a second electrode thereof may be connected to the second output terminal 1129. In addition, a gate electrode of the tenth transistor M10 may be connected to the second node N2. The tenth transistor M10 may control a connection between the first power supply input terminal 1126 and the second output terminal 1129 corresponding to the voltage of the second node N2.

A first electrode of the eleventh transistor M11 may be connected to the second output terminal 1129 and a second electrode thereof may be connected to the fifth input terminal 1128. In addition, a gate electrode of the eleventh transistor M11 may be connected to a fifth node N5. The eleventh transistor M11 may control a connection between the second output terminal 1129 and the fifth input terminal 1128 corresponding to a voltage of the fifth node N5.

The twelfth transistor M12 may be connected between the fourth node N4 and the fifth node N5. In addition, a gate electrode of the twelfth transistor M12 may be connected to the fifth input terminal 1128. The twelfth transistor M12 may be turned on when the fifth clock signal CLK5 is supplied to the fifth input terminal 1128 to electrically connect the fourth node N4 and the fifth node N5.

The third capacitor C3 may be connected between the fifth node N5 and the second output terminal 1129. The third capacitor C3 may store a voltage between the fifth node N5 and the second output terminal 1129.

The fourth capacitor C4 may be connected between the second node N2 and the first power supply input terminal 1126. The fourth capacitor C4 may store a voltage corresponding to the second node N2.

FIG. 14 is a waveform view illustrating an operation process of a stage shown in FIG. 13. In addition, FIGS. 15 to 18 are views illustrating an operation process of a stage corresponding to the waveform view of FIG. 14. Hereinafter, for convenience of explanation, it is assumed that the ith stage STi is the first stage. In addition, it is assumed that the fifth clock signal CLK5 and the sixth clock signal CLK6 are supplied when set to a low level.

Referring to FIGS. 13 and 14, the gate start pulse GSP, the first clock signal CLK1, and the sixth clock signal CLK6 may be supplied during the first period T1.

Figure 15:
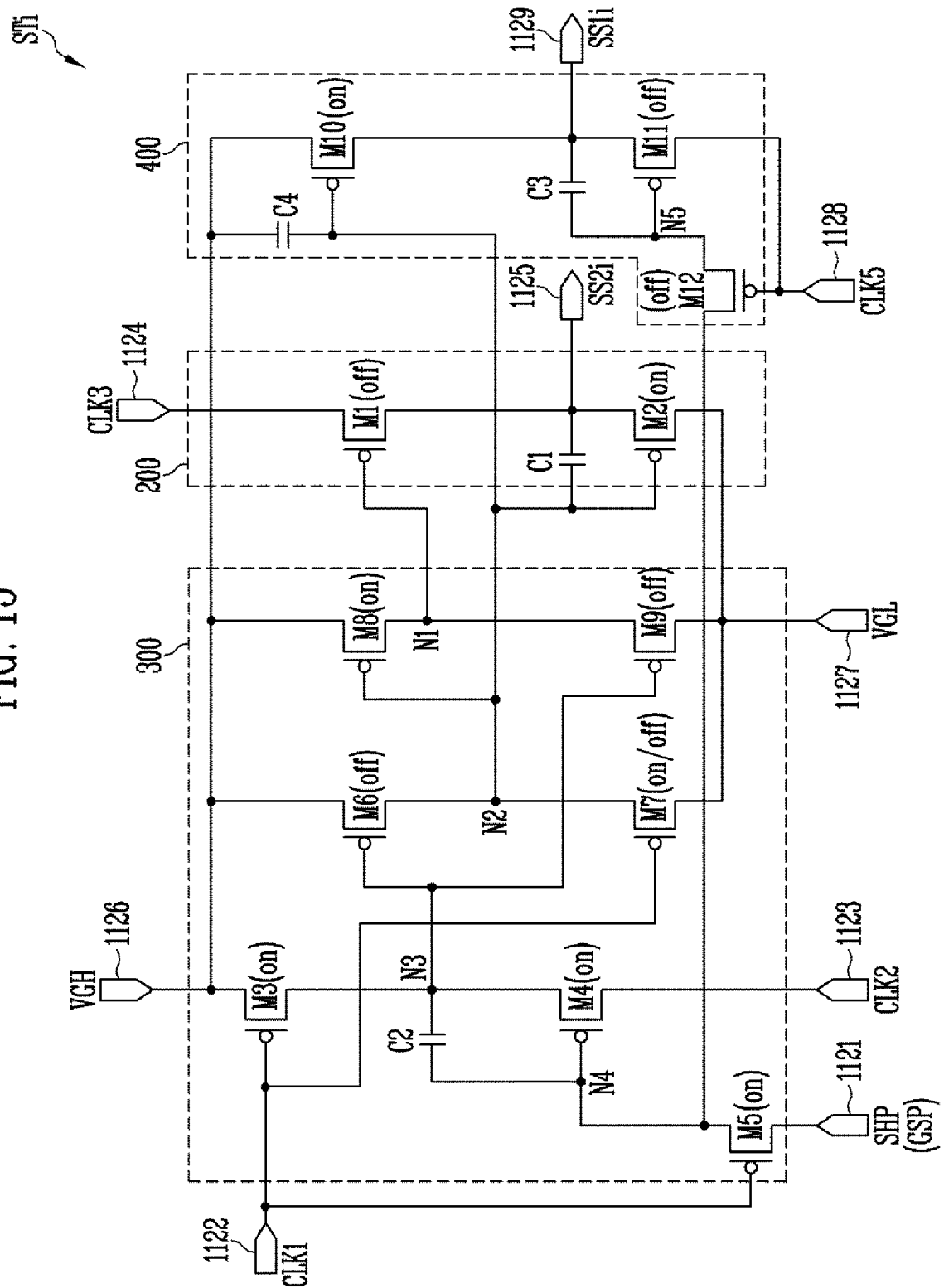
FIG. 15, FIG. 16, FIG. 17, and FIG. 18 are views illustrating an operation process of a stage corresponding to the waveform view of FIG. 14.

When the first clock signal CLK1 is supplied, the third transistor M3 and the fifth transistor M5 may be turned on, as shown in FIG. 15. In addition, when the first clock signal CLK1 is supplied, the seventh transistor M7 may be turned on or off corresponding to the voltage of the second node N2.

When the third transistor M3 is turned on, the voltage of the first power supply VGH may be supplied to the third node N3. When the voltage of the first power supply VGH is supplied to the third node N3, the sixth transistor M6 and the ninth transistor M9 may be turned off.

When the fifth transistor M5 is turned on, the gate start pulse GSP may be supplied to the fourth node N4. When the gate start pulse GSP is supplied to the fourth node N4, the fourth transistor M4 may be turned on. The second capacitor C2 may store a voltage corresponding to the turn-on state of the fourth transistor M4.

When the fourth transistor M4 is turned on, the third input terminal 1123 and the third node N3 may be electrically connected. Since the second clock signal CLK2 is not supplied to the third input terminal 1123 (i.e., a high-level voltage may be supplied to the third input terminal 1123), the voltage of the third node N3 may stably maintain the voltage of the first power supply VGH.

The second node N2 may maintain a low-level voltage (e.g., the first power supply VGL) by the voltage of the first capacitor C1 charged before the first period T1. Therefore, the second transistor M2, the eighth transistor M8 and the tenth transistor M10 may be turned on during the first period T1.

When the eighth transistor M8 is turned on, the voltage of the first power supply VGH may be supplied to the first node N1, so that the first transistor M1 may be turned off. When the second transistor M2 is turned on, the voltage of the second power supply VGL may be supplied to the first output terminal 1125. Therefore, the first output terminal 1125 may maintain a low-level voltage during the first period T1 (i.e., the second scan signal SS2i may not be supplied).

When the tenth transistor M10 is turned on, the voltage of the first power supply VGH may be supplied to the second output terminal 1129. Therefore, the second output terminal 1129 may maintain a high-level voltage during the first period T1 (i.e., the first scan signal SS1i may not be supplied). The eleventh transistor M11 may maintain the turn-off state corresponding to the voltage charged in the third capacitor C3 during the first period T1.

The second clock signal CLK2 may be supplied during the second period T2. In addition, the third clock signal CLK3 and the fifth clock signal CLK5 may be supplied during a portion of the second period T2. The fifth clock signal CLK5 may be set to a signal obtained by inverting the third clock signal CLK3. In addition, the second clock signal CLK2, the third clock signal CLK3 and the fifth clock signal CLK5 may be simultaneously supplied.

Figure 16:
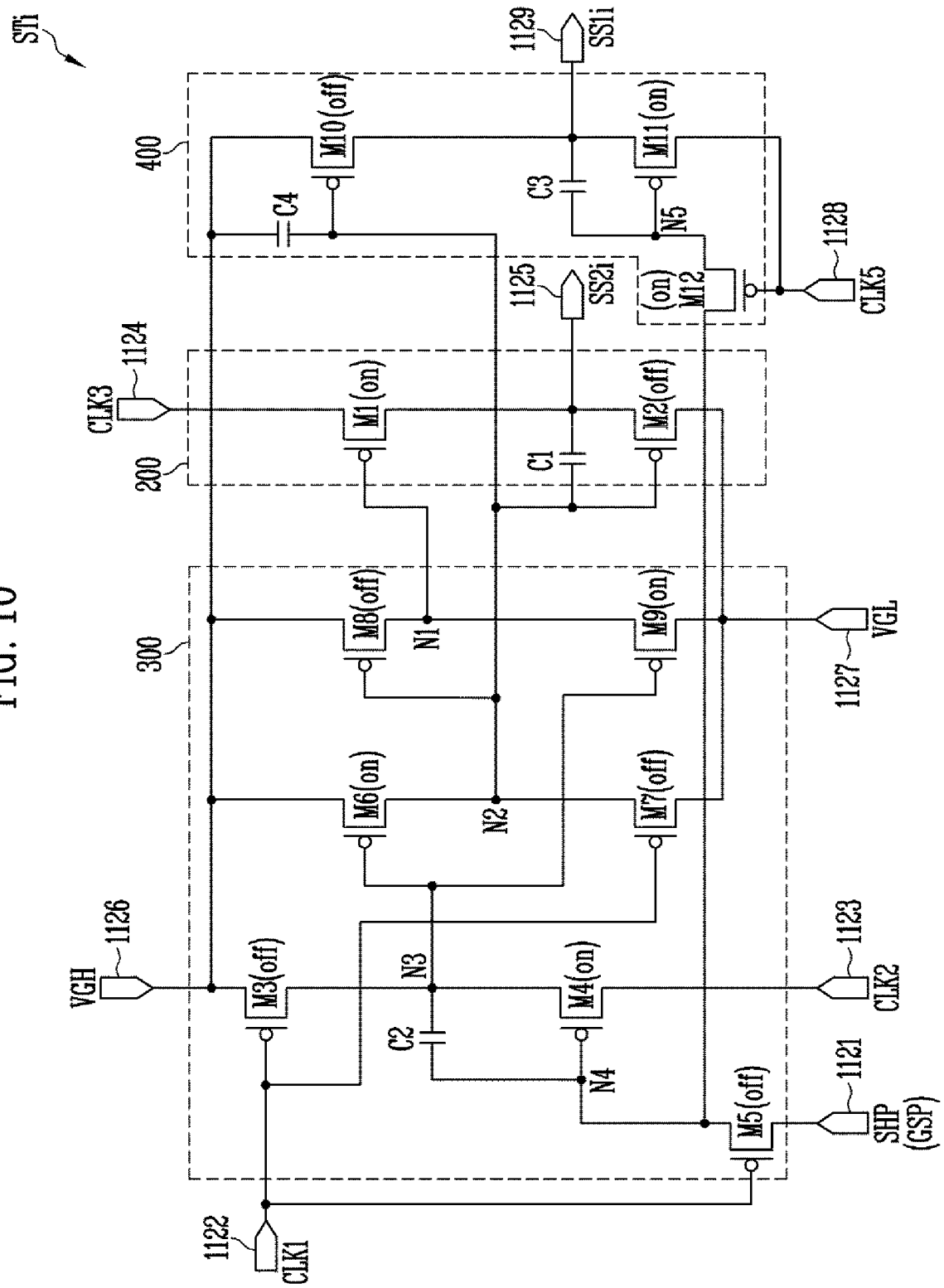

The fourth node N4 may be set to a low-level voltage corresponding to the voltage charged in the second capacitor C2 during the first period T1. Therefore, as shown in FIG. 16, the fourth transistor M4 may maintain the turn-on state during the second period T2. When the fourth transistor M4 maintains the turn-on state, the second clock signal CLK2 supplied to the third input terminal 1123 may be supplied to the third node N3. When the second clock signal CLK2 is supplied to the third node N3, the sixth transistor M6 and the ninth transistor M9 may be turned on.

When the sixth transistor M6 is turned on, the voltage of the first power supply VGH may be supplied to the second node N2. Accordingly, the second transistor M2, the eighth transistor M8 and the tenth transistor M10 may be turned off. When the ninth transistor M9 is turned on, the voltage of the second power supply VGL may be supplied to the first node N1, so that the first transistor M1 may be turned on.

When the first transistor M1 is turned on, a high-level voltage of the third clock signal CLK3 supplied to the fourth input terminal 1124 may be supplied to the first output terminal 1125. The high-level voltage of the third clock signal CLK3 supplied to the first output terminal 1125 may be supplied to the second scan signal SS2i.

When the fifth clock signal CLK5 is supplied, the twelfth transistor M12 may be turned on. When the twelfth transistor M12 is turned on, a low-level voltage of the fourth node N4 may be supplied to the fifth node N5, so that the eleventh transistor M11 may be turned on. The third capacitor C3 may store a voltage corresponding to the turn-on state of the eleventh transistor M11.

When the eleventh transistor M11 is turned on, a low-level voltage of the fifth clock signal CLK5 may be supplied to the second output terminal 1129. The low-level voltage of the fifth clock signal CLK5 supplied to the second output terminal 1129 may be supplied to the first scan signal SS1i. When the fifth clock signal CLK5 is supplied to the second output terminal 1129, the voltage of the fifth node N5 may be lowered by coupling of the third capacitor C3. Therefore, when the first scan signal SS1I is supplied to the second output terminal 1129, the eleventh transistor M11 may stably maintain the turn-on state.

Figure 17:
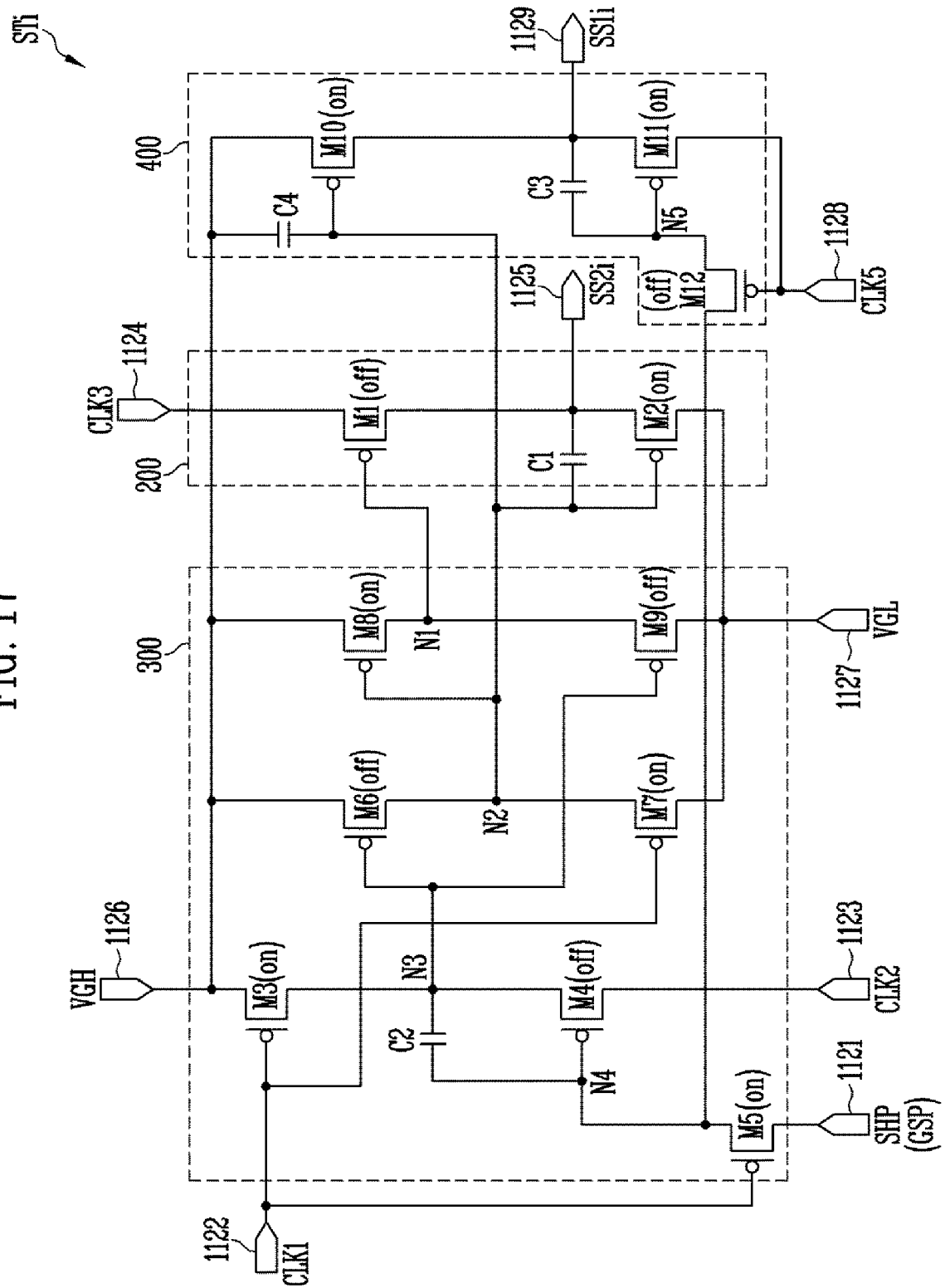
Figure 18:
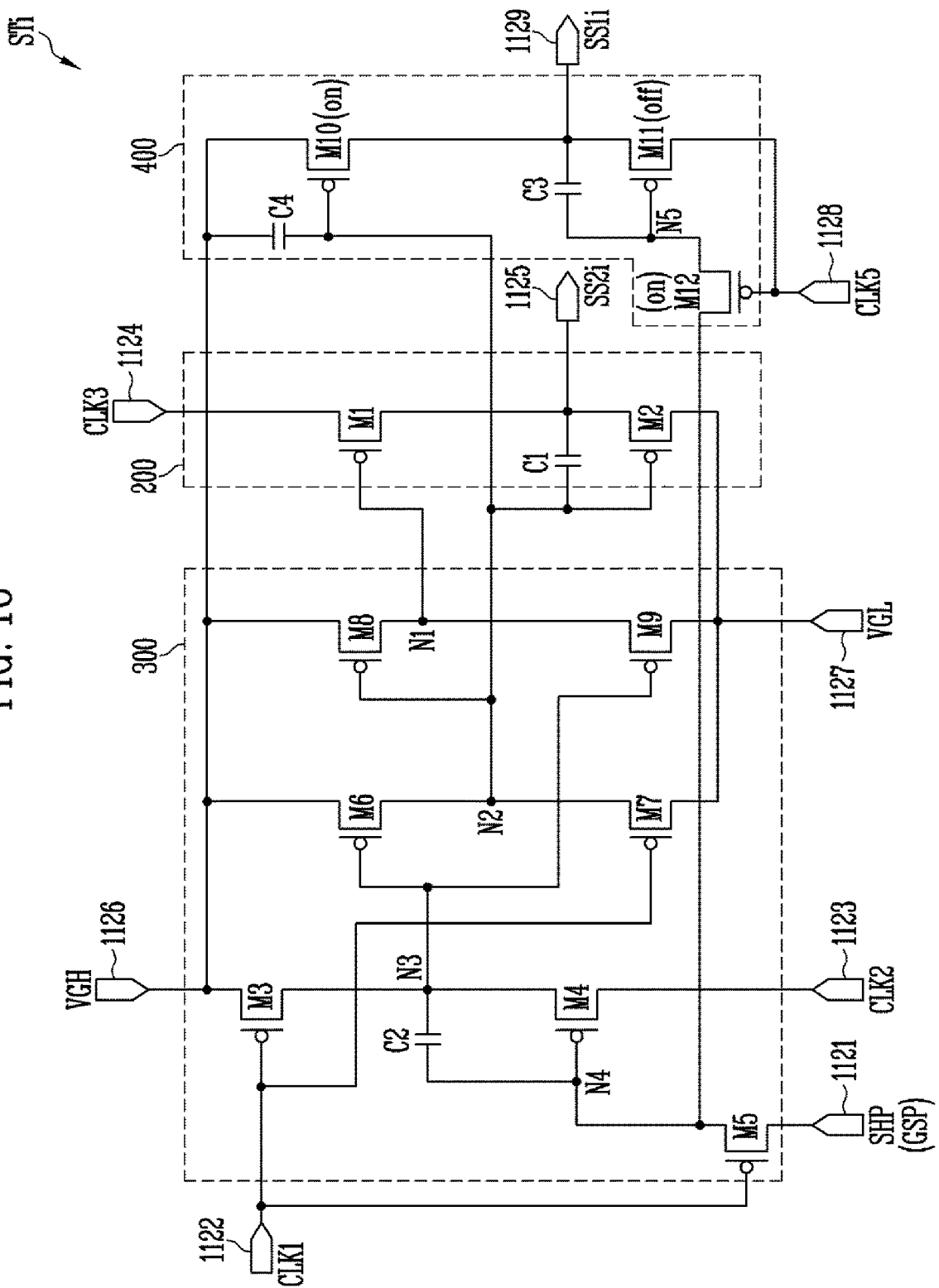

The first clock signal CLK1 may be supplied during the third period T3. When the first clock signal CLK1 is supplied, the third transistor M3, the fifth transistor M5 and the seventh transistor M7 may be turned on as shown in FIG. 17.

When the third transistor M3 is turned on, the voltage of the first power supply VGH may be supplied to the third node N3. When the voltage of the first power supply VGH is supplied to the third node N3, the sixth transistor M6 and the ninth transistor M9 may be turned off.

When the fifth transistor M5 is turned on, the first input terminal 1121 and the fourth node N4 may be electrically connected. Since the gate start pulse GSP is not supplied, the first input terminal 1121 may be set to a high-level voltage, so that the fourth node N4 may also be set to the high-level voltage. When the fourth node N4 is set to the high-level voltage, the fourth transistor M4 may be turned off. The second capacitor C2 may store a voltage corresponding to the turn-off state of the fourth transistor M4.

When the seventh transistor M7 is turned on, the voltage of the second power supply VGL may be supplied to the second node N2. When the voltage of the second power supply VGL is supplied to the second node N2, the second transistor M2, the eighth transistor M8 and the tenth transistor M10 may be turned on.

When the eighth transistor M8 is turned on, the voltage of the first power supply VGH may be supplied to the first node N1, so that the first transistor M1 may be turned off. When the second transistor M2 is turned on, the voltage of the second power supply VGL may be supplied to the first output terminal 1125.

When the second power supply VGL is supplied to the first output terminal 1125, the voltage of the second node N2 may be lowered by the coupling of the first capacitor C1, and the second transistor M2 may stably maintain the turn-on state accordingly.

When the tenth transistor M10 is turned on, the voltage of the first power supply VGH may be supplied to the second output terminal 1129. A voltage corresponding to the turn-on state of the tenth transistor M10 may be stored in the fourth capacitor C4.

The eleventh transistor M11 may maintain the turn-on state corresponding to a voltage of the third capacitor C3 during the third period T3. When the eleventh transistor M11 is turned on, the second output terminal 1129 and the fifth input terminal 1128 may be electrically connected. Since a high-level voltage is supplied to the fifth input terminal 1128, the second output terminal 129 may stably maintain the voltage of the first power supply VGH.

The fifth clock signal CLK5 may be supplied during a fourth period T4. When the fifth clock signal CLK5 is supplied, the twelfth transistor M12 may be turned on. When the twelfth transistor M12 is turned on, a high-level voltage of the fourth node N4 may be supplied to the fifth node N5, and the eleventh transistor M11 may be turned off accordingly. The tenth transistor M10 may maintain a turn-on state corresponding to the voltage stored in the fourth capacitor C4.

The stages according to the invention may supply first scan signals 551 to the first scan lines S1 and the second scan signals SS2 to the second scan lines S2 by repeating the above-described process.

Figure 19A:
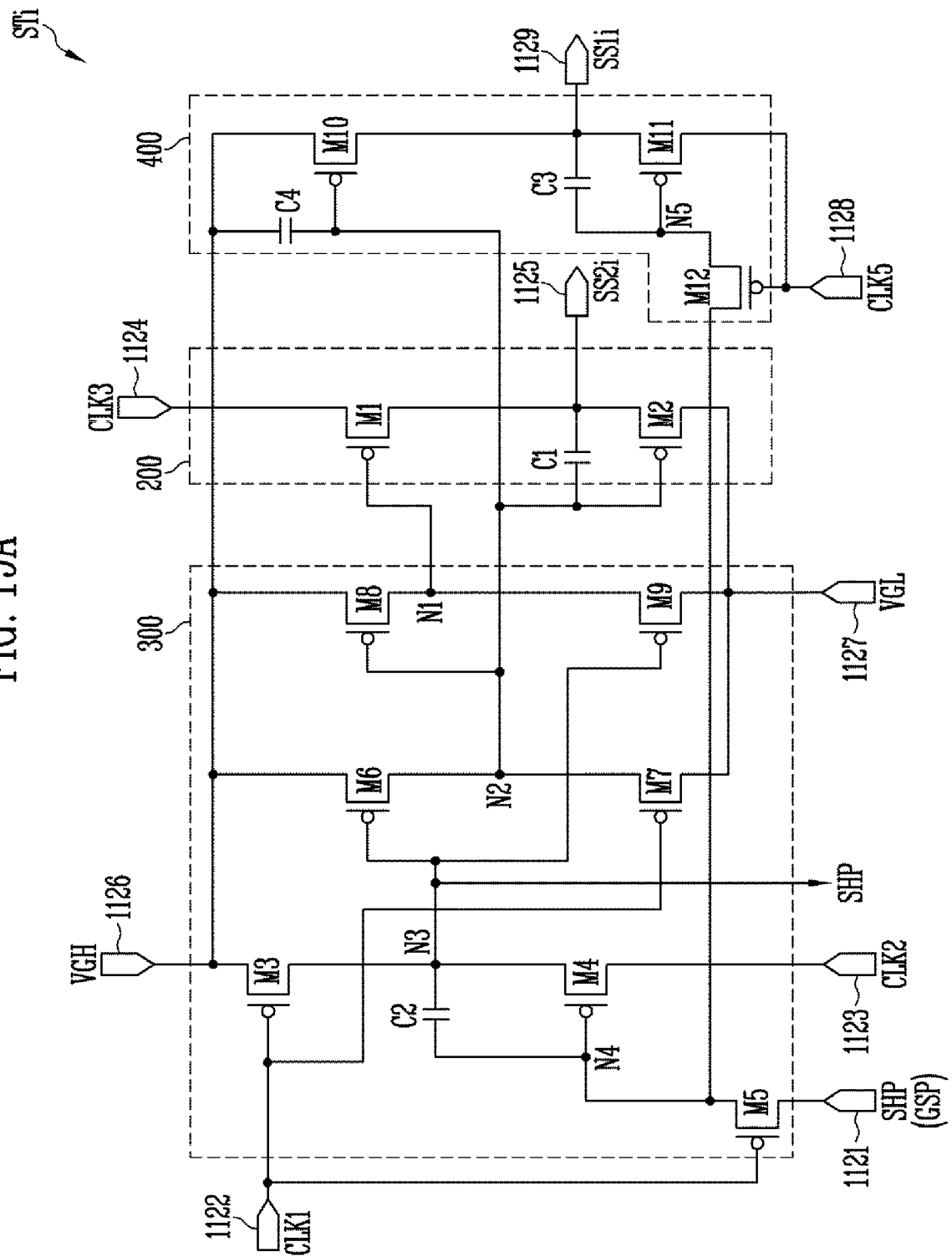
FIG. 19A and FIG. 19B are views illustrating a shift pulse output from a stage circuit shown in FIG. 13.
Figure 19B:
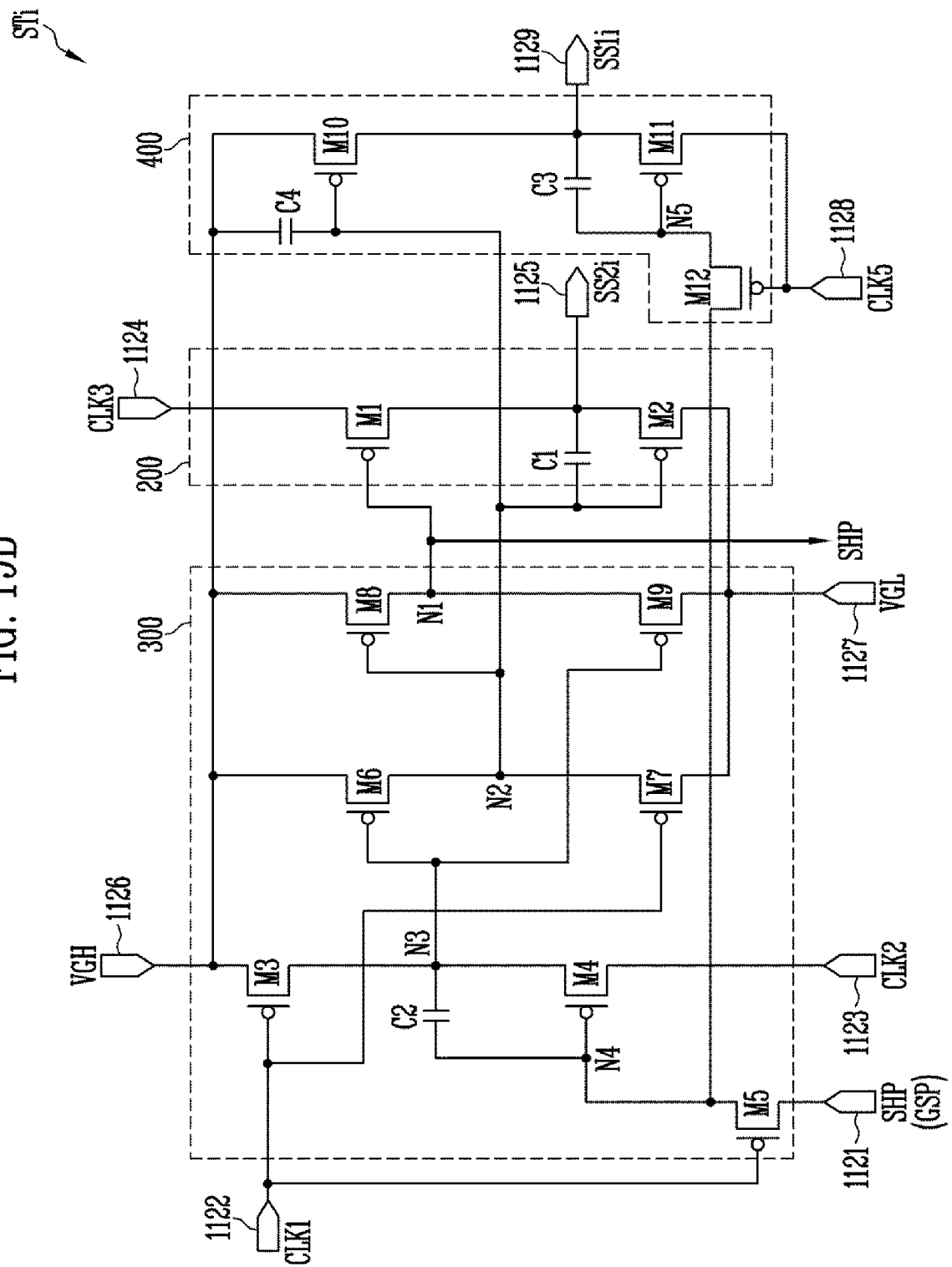

According to an exemplary embodiment of the invention, as shown in FIGS. 19A and 19B, the voltage of the first node N1 or the third node N3 may be supplied as the shift pulse SHP to a subsequent stage. The (i+1)th stage STi+1 receiving the shift pulse SHP from the ith stage STi may output the first scan signal and the second scan signal corresponding to the second clock signal CLK2 supplied to the second input terminal 1122, the first clock signal CLK1 supplied to the third input terminal 1123, the fourth clock signal CLK4 supplied to the fourth input terminal 1124 and the sixth clock signal CLK6 supplied to the fifth input terminal 1128.

According to a stage circuit and a scan driver using the same in accordance with an exemplary embodiment of the invention, a high-level scan signal may be supplied by using a stage. Specifically, the stage of the invention may control the width of a scan signal by using a clock signal.

In addition, according to another exemplary embodiment of the invention, a high-level scan signal and a low-level scan signal may be simultaneously provided by using a single stage. Accordingly, a mounting area of the stage may be minimized and manufacturing costs may be reduced.

While the invention has been particularly shown and described with reference to exemplary embodiments thereof, it is to be understood that the disclosure is not limited to the disclosed exemplary embodiments. In addition, it will be understood by those of skill in the art that various changes in form and details may be made without departing from the spirit and scope of the disclosure as set forth in the following claims.

The scope of the invention should not be limited to the details described in the detailed description of the specification, but should be defined by the claims. In addition, all changes or modifications derived from the meaning and scope of the claims and their equivalents should be construed as being included within the scope of the invention.

What is claimed is:

1. A stage circuit, comprising:
an input unit configured to control voltages of a first node and a second node, both first and second nodes contained in the input unit, by using a shift pulse or a gate start pulse input to a first input terminal, a first clock signal input to a second input terminal, a second clock signal input to a third input terminal, a first power supply input to a first power supply input terminal, and a second power supply input to a second power supply input terminal; and
a first output unit configured to receive a third clock signal from a fourth input terminal and the second power supply from the second power supply input terminal, and to output a high-level scan signal to a first output terminal corresponding to the voltages of the first node and the second node,
wherein:
a width of the high-level scan signal is the same as a width of a high level of the third clock signal and different from a width of a low level of each of the first and second clock signals; and
the low level of each of the first and second clock signals is a gate-on voltage to turn on a transistor.

2. The stage circuit of claim 1, wherein:
in response to an ith (i is a natural number) stage circuit being set to a first stage, the gate start pulse is supplied to the first input terminal; and
otherwise, the shift pulse is supplied from an (i−1)th stage to the first input terminal.

3. The stage circuit of claim 1, wherein the first clock signal, the second clock signal, and the third clock signal have a same cycle.

4. The stage circuit of claim 3, wherein the first clock signal and the second clock signal have a duty ratio of 50%, and the second clock signal is set to a signal obtained by inverting the first clock signal.

5. The stage circuit of claim 4, wherein the third clock signal is set to the high level during a first period of one cycle and set to a low level during a second period longer than the first period.

6. The stage circuit of claim 5, wherein a high-level period of the third clock signal overlaps a high-level period of the first clock signal.

7. The stage circuit of claim 1, wherein the first power supply is set to a gate-off voltage, and the second power supply is set to the gate-on voltage.

8. The stage circuit of claim 1, wherein the first output unit comprises:

a first transistor connected between the fourth input terminal and the first output terminal and comprising a gate electrode connected to the first node;

a second transistor connected between the first output terminal and the second power supply input terminal and comprising a gate electrode connected to the second node; and a first capacitor connected between the second node and the first output terminal.

9. The stage circuit of claim 1, wherein the input unit comprises:

a third transistor connected between the first power supply input terminal and a third node and comprising a gate electrode connected to the second input terminal;

a fourth transistor connected between the third node and the third input terminal and comprising a gate electrode connected to a fourth node;

a fifth transistor connected between the fourth node and the first input terminal and comprising a gate electrode connected to the second input terminal;

a sixth transistor connected between the first power supply input terminal and the second node and comprising a gate electrode connected to the third node;

a seventh transistor connected between the second node and the second power supply input terminal and comprising a gate electrode connected to the second input terminal;

an eighth transistor connected between the first power supply input terminal and the first node and comprising a gate electrode connected to the second node;

a ninth transistor connected between the first node and the second power supply input terminal and comprising a gate electrode connected to the third node; and a second capacitor connected between the third node and the fourth node.

10. The stage circuit of claim 9, wherein the input unit is configured to supply a voltage of the third node or the voltage of the first node as the shift pulse to a subsequent stage.

11. The stage circuit of claim 9, further comprising a second output unit configured to receive a fifth clock signal from a fifth input terminal and the first power supply from the first power supply input terminal, and to output a low-level scan signal to a second output terminal corresponding to the voltage of the second node and a voltage of the fourth node.

12. The stage circuit of claim 11, wherein the fifth clock signal is set to a signal obtained by inverting the third clock signal.

13. The stage circuit of claim 11, wherein the second output unit comprises:

a tenth transistor connected between the first power supply input terminal and the second output terminal and comprising a gate electrode connected to the second node;

an eleventh transistor connected between the second output terminal and the fifth input terminal and comprising a gate electrode connected to a fifth node;

a twelfth transistor connected between the fourth node and the fifth node and comprising a gate electrode connected to the fifth input terminal;

a third capacitor connected between the fifth node and the second output terminal; and a fourth capacitor connected between the first power supply input terminal and the second node.

14. A scan driver, comprising a plurality of stages configured to supply a low-level first scan signal to a first scan line and a high-level second scan signal to a second scan line, wherein:

an ith (i is a natural number) stage comprises:

an input unit configured to control voltages of a first node and a second node, both first and second nodes contained in the input unit, by using a shift pulse or a gate start pulse input to a first input terminal, a first clock signal input to a second input terminal, a second clock signal input to a third input terminal, a first power supply input to a first power supply input terminal, and a second power supply input to a second power supply input terminal;

a first output unit configured to receive a third clock signal from a fourth input terminal and the second power supply from the second power supply input terminal, and to output the second scan signal to a first output terminal corresponding to the voltages of the first node and the second node; and a second output unit configured to receive a fifth clock signal from a fifth input terminal and the first power supply from the first power supply input terminal, and to output the first scan signal to a second output terminal corresponding to the voltage of the second node;

the first output unit and the second output unit simultaneously output the high-level second scan signal and the low-level first scan signal, respectively; and a width of the high-level second scan signal is substantially the same as a width of the low-level first scan signal.

15. The scan driver of claim 14, wherein:

in response to the ith stage being set to a first stage, a gate start pulse is input to the first input terminal; and otherwise, the shift pulse is input from an (i−1)th stage.

16. The scan driver of claim 14, wherein the first clock signal, the second clock signal, the third clock signal, and the fifth clock signal have a same cycle.

17. The scan driver of claim 16, wherein the first clock signal and the second clock signal have a duty ratio of 50%, and the second clock signal is set to a signal obtained by inverting the first clock signal.

18. The scan driver of claim 17, wherein the third clock signal is set to a high level during a first period of one cycle, and set to a low level during a second period longer than the first period.

19. The scan driver of claim 18, wherein a high-level period of the third clock signal overlaps a high-level period of the first clock signal.

20. The scan driver of claim 18, wherein the fifth clock signal is set to a signal obtained by inverting the third clock signal.

21. The scan driver of claim 16, wherein the second clock signal is input to a second input terminal, the first clock signal is input to a third input terminal, a fourth clock signal is input to a fourth input terminal, and a sixth clock signal is input to a fifth input terminal of an (i+1)th stage circuit.

22. The scan driver of claim 21, wherein the fourth clock signal is set to a high level during a first period of one cycle, and set to a low level during a second period longer than the first period.

23. The scan driver of claim 22, wherein a high-level period of the fourth clock signal overlaps a high-level period of the second clock signal.

24. The scan driver of claim 22, wherein the sixth clock signal is set to a signal obtained by inverting the fourth clock signal.

25. The scan driver of claim 14, wherein the first power supply is set to a gate-off voltage, and the second power supply is set to a gate-on voltage.

26. The scan driver of claim 14, wherein the first output unit comprises:
- a first transistor connected between the fourth input terminal and the first output terminal and comprising a gate electrode connected to the first node;
- a second transistor connected between the first output terminal and the second power supply input terminal and comprising a gate electrode connected to the second node; and
- a first capacitor connected between the second node and the first output terminal.

27. The scan driver of claim 14, wherein the input unit comprises:
- a third transistor connected between the first power supply input terminal and a third node and comprising a gate electrode connected to the second input terminal;
- a fourth transistor connected between the third node and the third input terminal and comprising a gate electrode connected to a fourth node;
- a fifth transistor connected between the fourth node and the first input terminal and comprising a gate electrode connected to the second input terminal;
- a sixth transistor connected between the first power supply input terminal and the second node and comprising a gate electrode connected to the third node;
- a seventh transistor connected between the second node and the second power supply input terminal and comprising a gate electrode connected to the second input terminal;
- an eighth transistor connected between the first power supply input terminal and the first node and comprising a gate electrode connected to the second node;
- a ninth transistor connected between the first node and the second power supply input terminal and comprising a gate electrode connected to the third node; and
- a second capacitor connected between the third node and the fourth node.

28. The scan driver of claim 27, wherein the input unit is configured to supply a voltage of the third node or the voltage of the first node as the shift pulse to a subsequent stage.

29. The scan driver of claim 27, wherein the second output unit comprises:
- a tenth transistor connected between the first power supply input terminal and the second output terminal and comprising a gate electrode connected to the second node;
- an eleventh transistor connected between the second output terminal and the fifth input terminal and comprising a gate electrode connected to a fifth node;
- a twelfth transistor connected between the fourth node and the fifth node and comprising a gate electrode connected to the fifth input terminal;
- a third capacitor connected between the fifth node and the second output terminal; and
- a fourth capacitor connected between the first power supply input terminal and the second node.

* * * * *